United States Patent [19]

Calero

[11] Patent Number: 5,576,618

[45] Date of Patent: Nov. 19, 1996

[54] PROCESS AND APPARATUS FOR COMPARING IN REAL TIME PHASE DIFFERENCES BETWEEN PHASORS

[75] Inventor: Fernando Calero, Miami, Fla.

[73] Assignee: ABB Power T&D Company, Inc., Raleigh, N.C.

[21] Appl. No.: 326,720

[22] Filed: Oct. 20, 1994

[51] Int. Cl.⁶ .................................................. G01K 25/00
[52] U.S. Cl. ...................... 324/76.15; 324/76.13; 324/76.38; 324/76.77; 324/771
[58] Field of Search ................................ 324/76.13, 76.15, 324/76.22, 76.24, 76.38, 76.52, 76.54, 76.55, 76.58, 76.77, 76.82, 86, 539, 771, 772

[56] References Cited

U.S. PATENT DOCUMENTS

| | | |
|---|---|---|
| 3,740,491 | 6/1973 | Cook et al. ................. 179/100.2 R |
| 4,851,782 | 7/1989 | Jeerings et al. ..................... 324/520 |
| 4,908,825 | 3/1990 | Vea ................................. 370/110.3 |
| 4,968,960 | 11/1990 | Bouhenguel et al. .............. 335/101 |
| 5,151,866 | 9/1992 | Glaser et al. .................. 324/141 X |
| 5,438,254 | 8/1995 | Ho et al. ........................ 324/76.82 |
| 5,451,956 | 9/1995 | Lochhead .................... 324/76.38 X |

Primary Examiner—Kenneth A. Wieder
Assistant Examiner—Glenn W. Brown
Attorney, Agent, or Firm—Woodcock Washburn Kurtz Mackiewicz & Norris

[57] ABSTRACT

A numerical comparator is disclosed. The numerical comparator employs numerical techniques based upon the behavior of the cylinder unit to compare phasors in real time. In one application of this invention, the torque signal generated by the numerical comparator, $M_{k+1}$, is employed to determine whether a fault has occurred in a transmission line. Another application involves employing the output $M_{k+1}$ to determine the direction of power flow in the transmission line. In yet another application, the output $M_{k+1}$ is used to determine whether a voltage or current has exceeded a predetermined threshold.

39 Claims, 17 Drawing Sheets

PROCESS AND APPARATUS FOR COMPARING IN REAL TIME PHASE DIFFERENCES BETWEEN PHASORS

FIELD OF THE INVENTION

The present invention relates generally to a numerical comparator for comparing two phasor quantities in real time, and more particularly to a numerical comparator for use in protective relaying.

BACKGROUND OF THE INVENTION

Protective relaying generally involves the performance of one or more of the following functions in connection with a protected power or energy system: (a) monitoring the system to ascertain whether it is in a normal or abnormal state; (b) metering, which involves measuring certain electrical quantities; (c) protection, which typically involves tripping a circuit breaker in response to the detection of a short-circuit condition; and (d) alarming, which provides a warning of some impending problem. In connection with these and other ancillary functions, such as fault detection, detection of power flow direction, over-current detection, etc., the protective relaying system must compare phasor quantities (voltages and currents). Generally, the faster such a comparison can be made, the better.

Prior to the present invention, protective relays compared phasor quantities using frequency domain techniques such as the Fourier transform. A primary goal of the present invention is to provide methods and apparatus for comparing phasor quantities in real time.

SUMMARY OF THE INVENTION

The present invention employs numerical techniques, based upon the behavior of the cylinder unit (described below), to compare phasors in real time. The time-dependent procedures disclosed in this specification compare phasors faster than any previously known method.

According to the present invention, a real-time process or apparatus for comparing two phasors, represented by waveforms referred to herein as "S1" "S2" comprises the steps of or means for obtaining a sample ($S1_k$) of the instantaneous magnitude of a first phasor at a first instant of time, and obtaining a sample ($S2_k$) of the instantaneous magnitude of a second phasor at the first instant of time; subsequently, obtaining a sample ($S1_{k+1}$) of the instantaneous magnitude of the first phasor at a second instant of time, and obtaining a sample ($S2_{k+1}$) of the instantaneous magnitude of the second phasor at the second instant of time; and then obtaining derived quantities $B1_k$, $B2_k$, $B1_{k+1}$ and $B2_{k+1}$ from $S1_k$, $S1_{k+1}$, $S2_k$, $S2_{k+1}$; multiplying $B1_k$ by $B2_{k+1}$ and multiplying $B2_k$ by $B1_{k+1}$ to produce a first product $B1_k B2_{k+1}$ and a second product $B2_k B1_{k+1}$; summing the first and second products to produce a sum; and, finally, scaling the sum to produce a result ($M_{k+1}$) indicative of a phase difference, if any, between the first and second phasors. The scaling step preferably comprises multiplying the sum by a predetermined number proportional to the sampling period.

The B1 and B2 waveforms are derived from the two inputs to the numerical comparator disclosed herein. These input waveforms are referred as "S1" and "S2". The relationship between S1 and B1 involves the sampled values $S1_k$ and $S1_{k-1}$. The relationship between S2 and B2 involves the sampled values $S2_k$ and $S2_{k-1}$. In the embodiment of the invention described below, these relationships are:

$$FK1 = \frac{\Delta t\, RB - 2LB}{\Delta t}$$

$$FK2 = \frac{\Delta t}{\Delta t\, RB + 2LB}$$

$$B1_k = FK2\,[S1_k + S1_{k-1} - FK1\, B1_{k-1}]$$

$$B2_k = FK2\,[S2_k + S2_{k-1} - FK1\, B2_{k-1}]$$

where "RB" and "LB" represent constants set to make the unit more efficient. The same is true for S2 and B2, i.e., FK1 and FK2 are combined with $S2_k$ and $S2_{k-1}$ as shown above for S1.

In preferred embodiments of the invention, the waveforms S1(t) and S2(t) are voltages, currents or a combination of voltages and currents that oscillate sinusoidally.

In one preferred application of this invention, the result $M_{k+1}$ is employed to determine whether a fault has occurred in a transmission line. For example, the result can be employed to detect a phase-to-phase fault in a three phase transmission line. In this case, S1(t) and S2(t) are preferably obtained from the phase-to-phase voltages and the phase currents.

In another preferred application, the result is employed to detect a phase-to-ground fault in a three-phase transmission line system. In this embodiment of the invention, S1(t) and S2(t) are preferably obtained from the phase-to-ground voltages and the phase currents.

Another preferred application of this invention involves employing the result $M_{k+1}$ to determine the direction of power flow in the transmission line. A transmission line can take the form of a set of three conductors going from point "A" to point "B". If a device performing the directional function is positioned at point A, the power flow direction (from A to B or from B to A) should be indicated by the directional device. Typically, there are two types of directional units in use—phase and ground. Several types of directional unit are disclosed herein. The phase directional unit utilizes phase-to-phase voltages and phase currents. The ground directional units are the zero sequence polarized ground directional unit, the negative sequence polarized ground directional unit, and the current polarized ground directional unit. In all these units, the position of the input phasors, S1 and S2, phase-wise, with respect to each other, determines whether the power flow direction is "forward" or "reverse."

In yet another application of the present invention, voltages and/or currents are sampled and the result $M_{k+1}$ is used to determine whether a voltage or current has exceeded a predetermined threshold.

In addition, a predetermined constant (MC) can be subtracted from the result $M_k$, and the difference $M_k - MC$ can be employed to obtain a signal ($\theta_k$) indicative of the energy contained in S1 and S2. It should be noted that the present invention provides the protective relaying art a means to compare the phase relationship between S1 and S2 as well as the energy content of the two combined signals. No other numerical method known in the industry has inherently demonstrated the capacity of determining its operation depending on the energy content of the S1 and S2 inputs. This characteristic is necessary in protective relaying applications in which the operating time is inversely related to the energy content. That is, the relationship between the operating time and the energy content of the input signals is inversely related. Methods such as Fourier filtering, widely used in the industry, do not provide any signs of inverseness. The operating speed is totally independent of the energy content of the inputs.

In sum, the inputs S1 and S2 to the numerical comparator will determine the characteristics of the unit to be obtained. There are numerous applications for the numerical comparator disclosed herein, including the protective relaying applications described above and others.

BRIEF DESCRIPTION OF THE DRAWINGS

FIG. 3B depicts the phasor characteristics of the cylinder unit depicted in FIG. 2A, which are analogous to the phasor characteristics of the numerical comparator and its output M.

FIG. 6B depicts a Clarke component-based symmetrical components filter. FIG. 6C depicts a direct phase shift symmetrical components filter.

DETAILED DESCRIPTION OF PREFERRED EMBODIMENTS

A. Brief Overview

Figure 1:
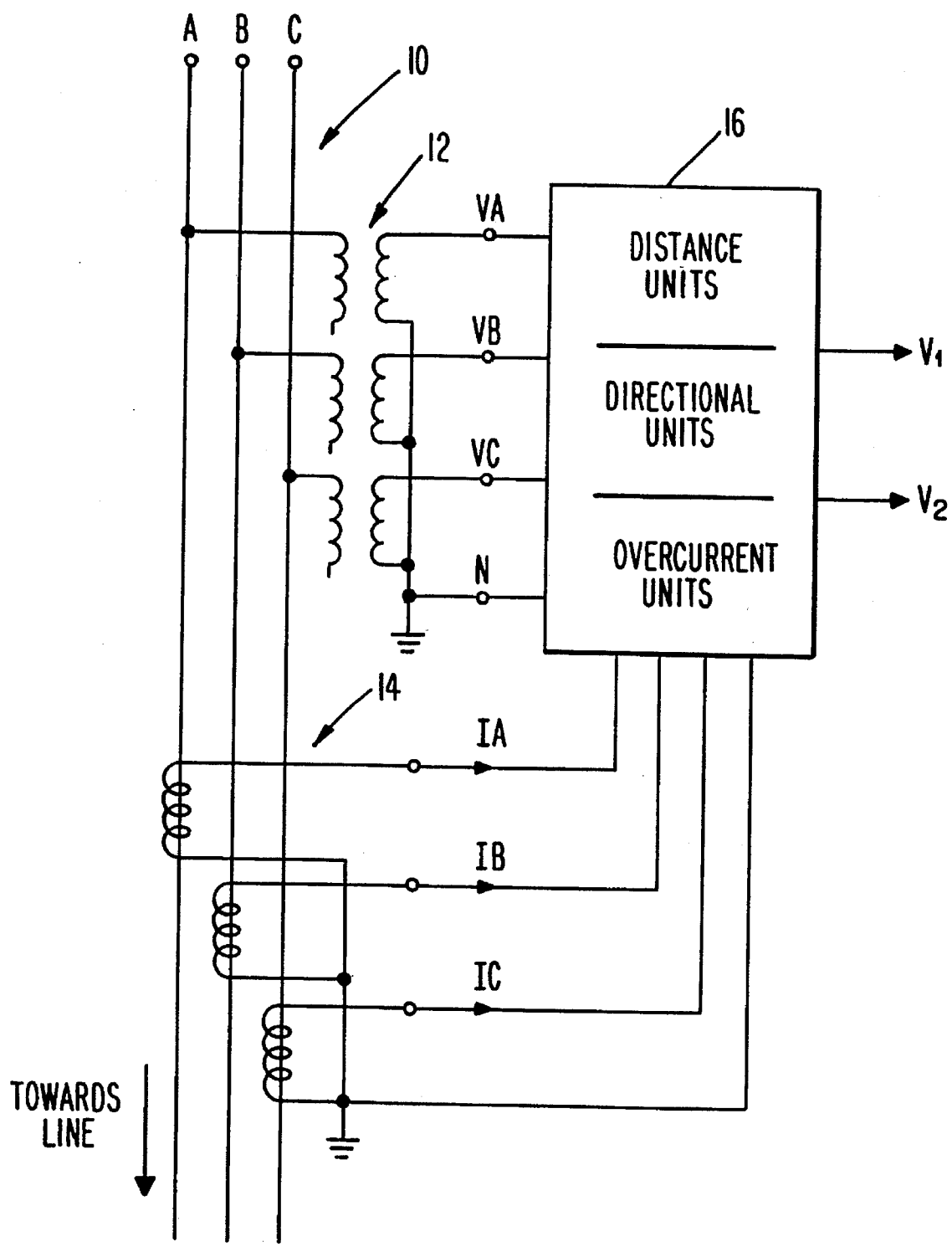
FIG. 1 schematically depicts the power system inputs for protective relaying applications and/or numerical comparator applications.

Protective relaying is a science concerned with protecting electrical equipment drawing voltages and currents from a power system. The protective relaying system requires certain inputs from a transmission line 10, which includes three phase conductors A, B, C. FIG. 1 illustrates the traditional way of obtaining the required inputs. As shown, voltage inputs VA, VB, VC are obtained by voltage transformers 12 and current inputs IA, IB, IC are obtained by current transformers 14. The quantities available for the protective relaying apparatus 16 are the phase voltages VA, VB, VC; the zero sequence voltage 3V0=VA+VB+VC; the phase currents IA, IB, IC; and the zero sequence current 3I0=IA+IB+IC.

B. Real-Time Phase Comparator Modeled After Cylinder Unit

Figure 2A:
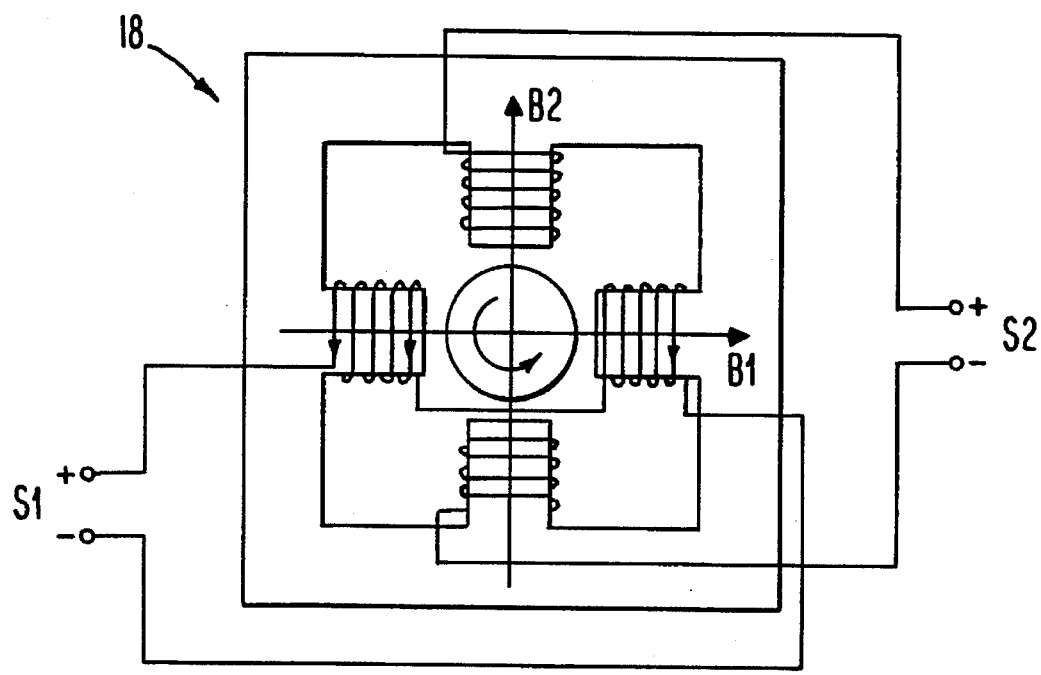
FIG. 2A schematically depicts a cylinder unit with inputs S1 and S2.

A comparator is a device used in protective relays to compare two phasor quantities in phase and/or magnitude. The cylinder unit 18, schematically depicted in FIG. 2A, is a well-known type of comparator used in electromechanical relays. Two outstanding characteristics of the cylinder unit are its insensitivity to DC offset and speed of operation.

When two voltages S1 and S2 are applied to the cylinder unit 18, flux densities B1 and B2 are produced. These flux densities are vectors distributed on the surface of the rotating cylinder. If B1 and B2 are time-dependent, currents are induced in the cylinder, and these currents are proportional to the rate of change of B1 and B2, represented as dB1/dt and dB2/dt, and the angle theta (θ), which is the phase difference between S1 and S2. These cylinder currents are directed toward the positive Z axis (i.e., perpendicular to the plane of FIG. 1). Using the vector force equation (below), the force vector field around the surface of the cylinder can be found:

$$\bar{F} = (\bar{I} \times \bar{B})l$$

The torque on the Z axis is the quantity of interest. This torque can be calculated by summing the torque components.

$$\bar{M} = \Sigma \bar{r} \times \bar{F}$$

The torque expressed in terms of flux densities B1, B2 is:

$$\bar{M} = \left[ \frac{\sigma \pi r^3 l^2 T}{l + 2r} \right] \left[ B1(t) \frac{dB2(t)}{dt} - B2(t) \frac{dB1(t)}{dt} \right] z$$

or $$\bar{M} = K \left[ B1(t) \frac{dB2(t)}{dt} - B2(t) \frac{dB1(t)}{dt} \right] z$$

where,
σ=electric conductivity (mhos/m)
π=3.1415
r=cylinder radius
l=cylinder length T=cylinder thickness.

If two time varying voltages S1(t) and S2(t) are applied to the cylinder unit 18, a time varying flux density B(t) will be produced. The flux density B(t) will have components B1(t) and B2(t) related to S1(t) and S2(t) as:

$$S1(t) = -\frac{d\lambda 1}{dt} = -N1\,A\,\frac{dB1}{dt}$$

$$S2(t) = -\frac{d\lambda 2}{dt} = -N1\,A\,\frac{dB2}{dt}$$

$$B1(t+\Delta t) = \frac{-1}{AN1}\int_{t}^{t+\Delta t} S1(t)dt + B1(t)$$

$$B2(t+\Delta t) = \frac{-1}{AN2}\int_{t}^{t+\Delta t} S2(t)dt + B2(t)$$

where N1 and N2 are the number of turns of the S1 and S2 input windings.

It should be mentioned that these equations do not contain any loss mechanism. The following relationships do contain losses and can be used to relate the S (inputs) and B terms.

$$S1(t) = \left[ LB\frac{dB1}{dt} + RB\,B1 \right]$$

$$S2(t) = \left[ LB\frac{dB2}{dt} + RB\,B2 \right]$$

where LB and RB are constants that can be determined to make the model more efficient.

Figure 2B:
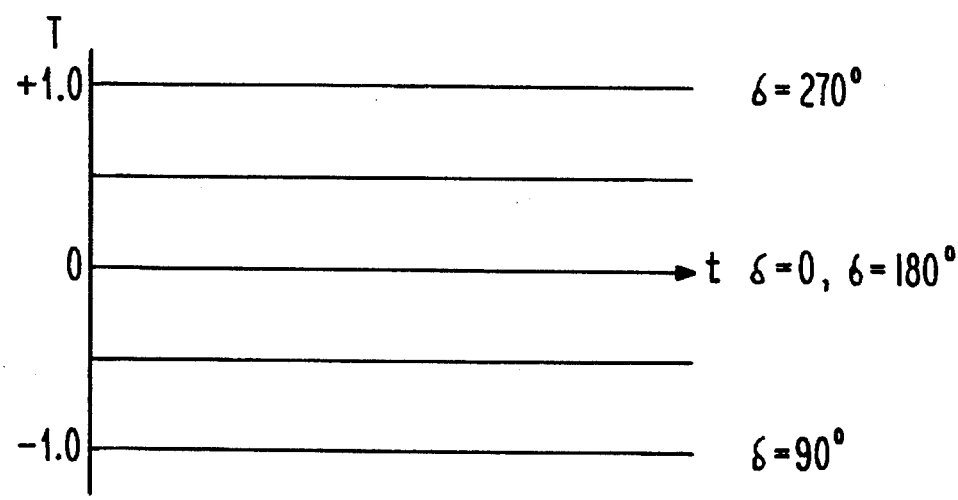
FIG. 2B depicts the expected torque vs. phase angle (between S1 and S2) characteristics of a cylinder unit.

If S1(t) and S2(t) are sine waves, such as
S1(t)=Sin (ωt)
S2(t)=Sin (ωt+δ),
the torque in P.U. (per unit) terms will be:
M=0 when δ=0
M=−1 when δ=90°
M=0 when δ=180°
M=1 when δ=270°
as depicted in FIG. 2B.

To apply the above equations to protective relays based on microprocessors and/or microcontrollers, they can be discretized using the trapezoidal rule:

$$B1_k = \left[ \frac{\Delta t}{\Delta t\,RB + 2LB} \right]\left[ S1_k + S1_{k-1} - \left( \frac{\Delta t\,RB - 2LB}{\Delta t} \right)B1_{k-1} \right]$$

and $$B2_k = \left[ \frac{\Delta t}{\Delta t\,RB + 2LB} \right]\left[ S2_k + S2_{k-1} - \left( \frac{\Delta t\,RB - 2LB}{\Delta t} \right)B2_{k-1} \right]$$

$$B1_k = FK2[S1_k + S1_{k-1} - FK1\,B1_{k-1}]$$

$$B2_k = FK2[S2_k + S2_{k-1} - FK1\,B2_{k-1}]$$

where:

$$FK1 = \frac{\Delta t\,RB - 2LB}{\Delta t}$$

$$FK2 = \frac{\Delta t}{\Delta t\,RB + 2LB}$$

and the torque can be expressed as:

$$M_k = B2_k B1_{k-1} - B1_k B2_{k-1}$$

where:
k+1=actual sample
k=previous sample

Δt=sampling period.

Figure 3A:
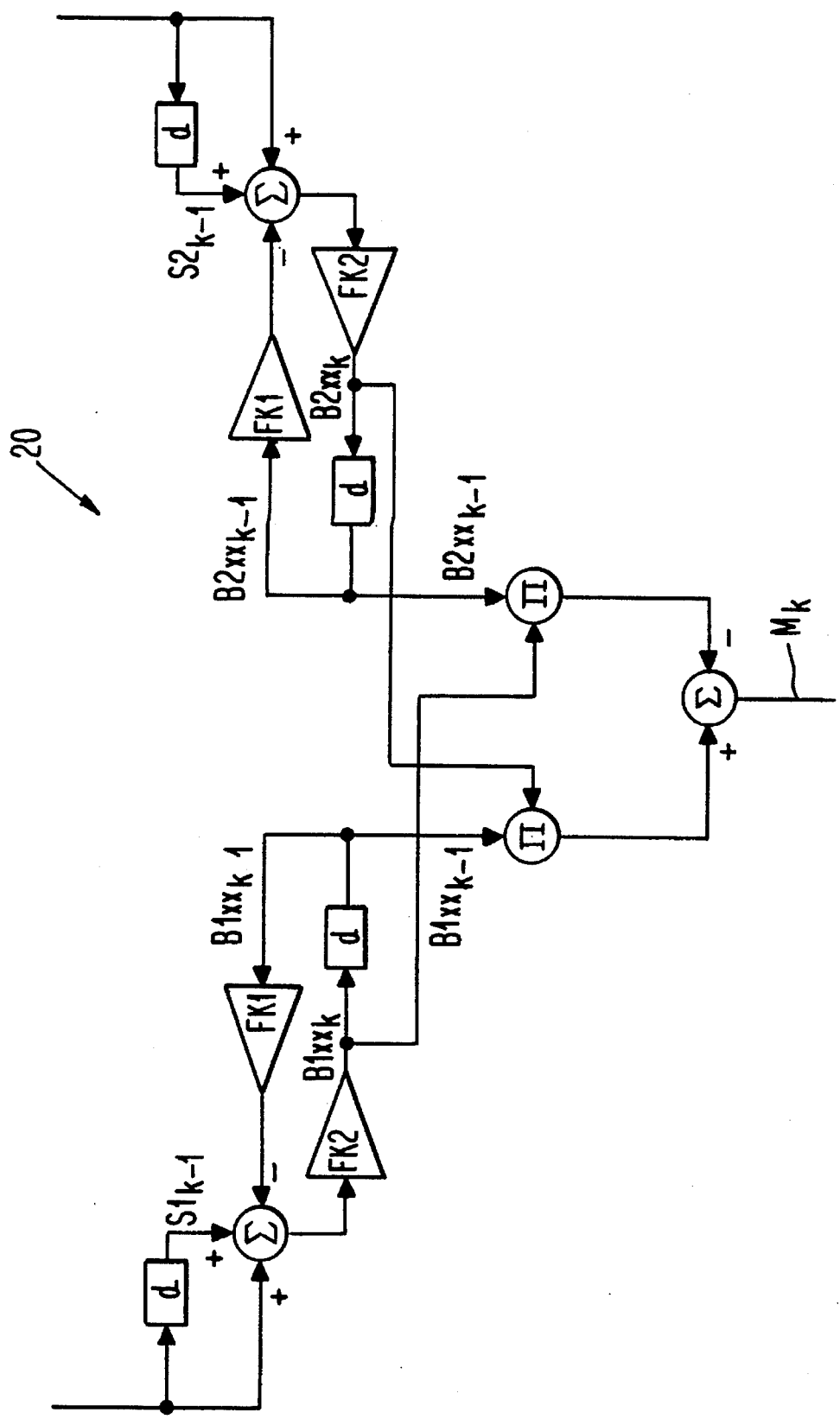
FIG. 3A is a block diagram of a numerical comparator in accordance with the present invention. This embodiment of the invention computes $M_{k+1}$ in real time, wherein $M_{k+1}$ is analogous to the torque of a cylinder unit.
Figure 3B:
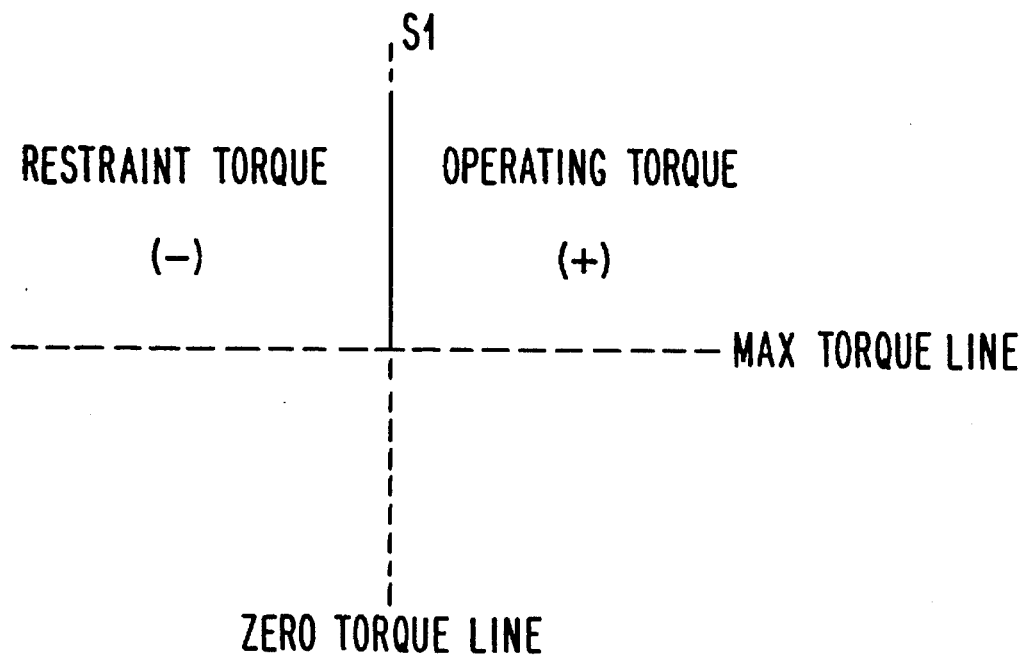
FIG. 3B depicts the phasor characteristics of the numerical comparator depicted in FIG. 3A.

FIG. 3A is a block diagram of a numerical comparator circuit or system 20 for computing $M_k$. In the system of FIG. 3A, "d" denotes a delay unit; "Σ" denotes a summing unit; "Π" denotes a multiplier; and "FK1", "FK2" are amplifiers. The output $M_k$ of the system 20 represents the real time torque $M_k$ of a comparator having the phasor characteristics depicted in FIG. 3B, which illustrates the operating characteristics of the numerical comparator 20. Having S1 as the reference, a phase difference of 0 to negative 180° indicates operation of the unit. A phase difference of 0 to positive 180° indicates no-operation or restraint of the unit.

This procedure can be employed in distance relays, pilot wire relays, directional relays, over-current relays, over/under voltage relays, etc., where a real-time comparison of two phasor quantities is desired. In specific applications of this invention, mechanical influences to the model, such as a restraining spring force, friction force, and/or bias force, can be included as necessary.

C. Distance Unit For Fault Detection

A procedure for obtaining distance units employing a numerical comparator is described next.

Protective relaying concerns the detection of faults in power apparatus. In transmission line relaying, distance relays are used to detect several types of faults in the transmission line. These devices detect faults in transmission lines up to certain reaches or distances. In general, these devices measure the impedance, which is proportional to the distance from the relay location to the fault (hence the name "distance unit"). The digital/numerical distance units derived by this procedure detect faults faster than prior art fault detectors, but otherwise behave like known electromechanical distance units. The numerical methods disclosed herein are less vulnerable to transients and noise than any other time domain method. This is due to the analogy to the cylinder unit, which has shown to operate well under transients.

1. Phase-To-Phase Unit

To detect phase-to-phase faults, the inputs to the numerical comparator are:

$$S1 = VA - VB - (IA - IB)$$

$$S2 = VC - VB - (IC - IB)$$

Figure 4A:
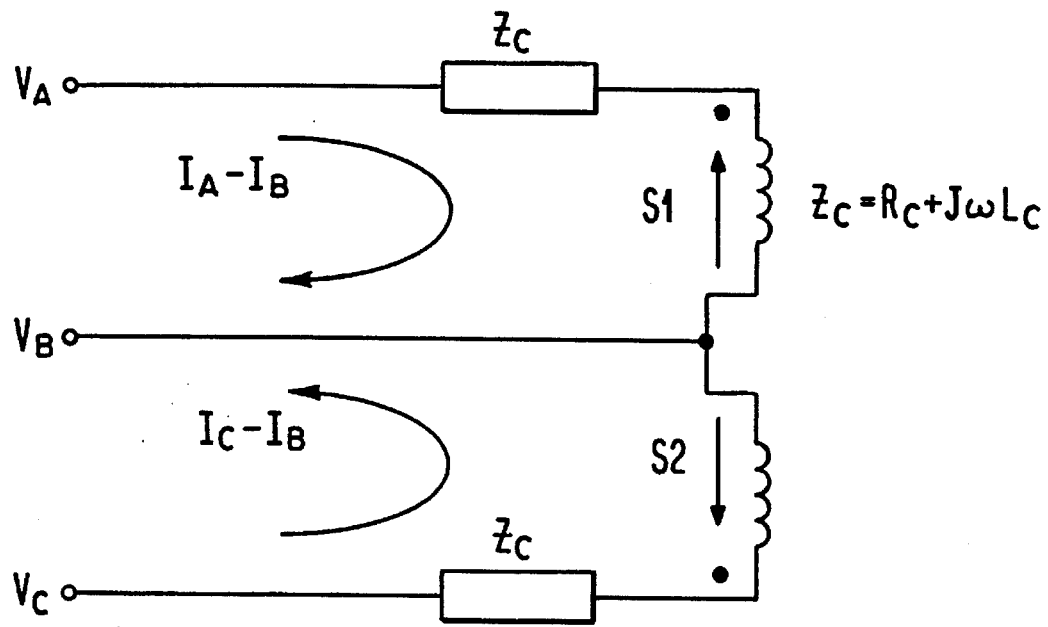
FIG. 4A depicts a circuit that simulates equations that define the inputs to a numerical comparator-based phase-to-phase distance unit in accordance with the present invention.

The circuit depicted in FIG. 4A simulates these equations. Therefore, S1(t) and S2(t) may be derived from the phase-to-phase voltages and currents as follows:

$$s1(t) = va(t) - vb(t) - (ia(t) - ib(t))\left( Rc + Lc\frac{d}{dt} \right)$$

$$s2(t) = vc(t) - vb(t) - (ic(t) - ib(t))\left( Rc + Lc\frac{d}{dt} \right)$$

If we make the equations discrete and apply them to the cylinder unit model derived above, we obtain:

$$S1_k = Va_k - Vb_k - \left( Rc + \frac{Lc}{\Delta t} \right)Ia_k + \left( \frac{Lc}{\Delta t} \right)Ia_{k-1} +$$

$$\left( Rc + \frac{Lc}{\Delta t} \right)Ib_k - \left( \frac{Lc}{\Delta t} \right)Ib_{k-1}$$

$$S2_k = Vc_k - Vb_k - \left( Rc + \frac{Lc}{\Delta t} \right)Ic_k + \left( \frac{Lc}{\Delta t} \right)Ic_{k-1} +$$

$$\left(Rc+\frac{Lc}{\Delta t}\right)Ib_k - \left(\frac{Lc}{\Delta t}\right)Ib_{k-1}$$

which are the inputs to the numerical comparator (also called the "torque generator") derived above. $S1_k$ and $S2_k$ are then used to obtain $B1_k$, $B2_k$ and $M_k$ as described above.

The above equations are discrete realizations of a phase-to-phase distance unit that will detect all types of faults involving two phases and some phase-to-phase-to-ground faults.

Figure 4C:
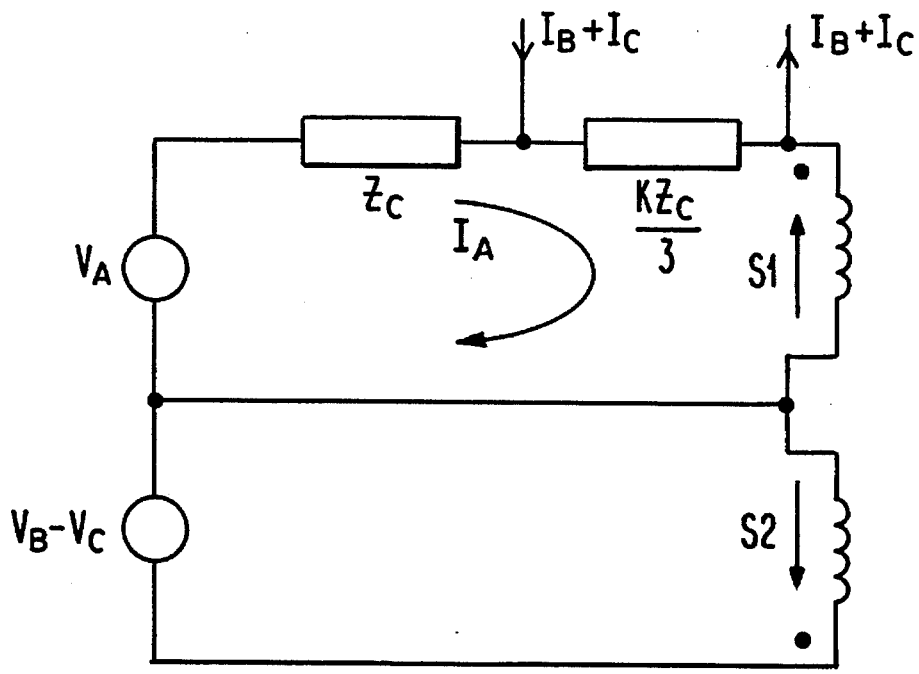
FIG. 4C depicts a circuit that simulates equations that define the inputs to a numerical comparator based phase-to-ground distance unit in accordance with the present invention.
Figure 4B:
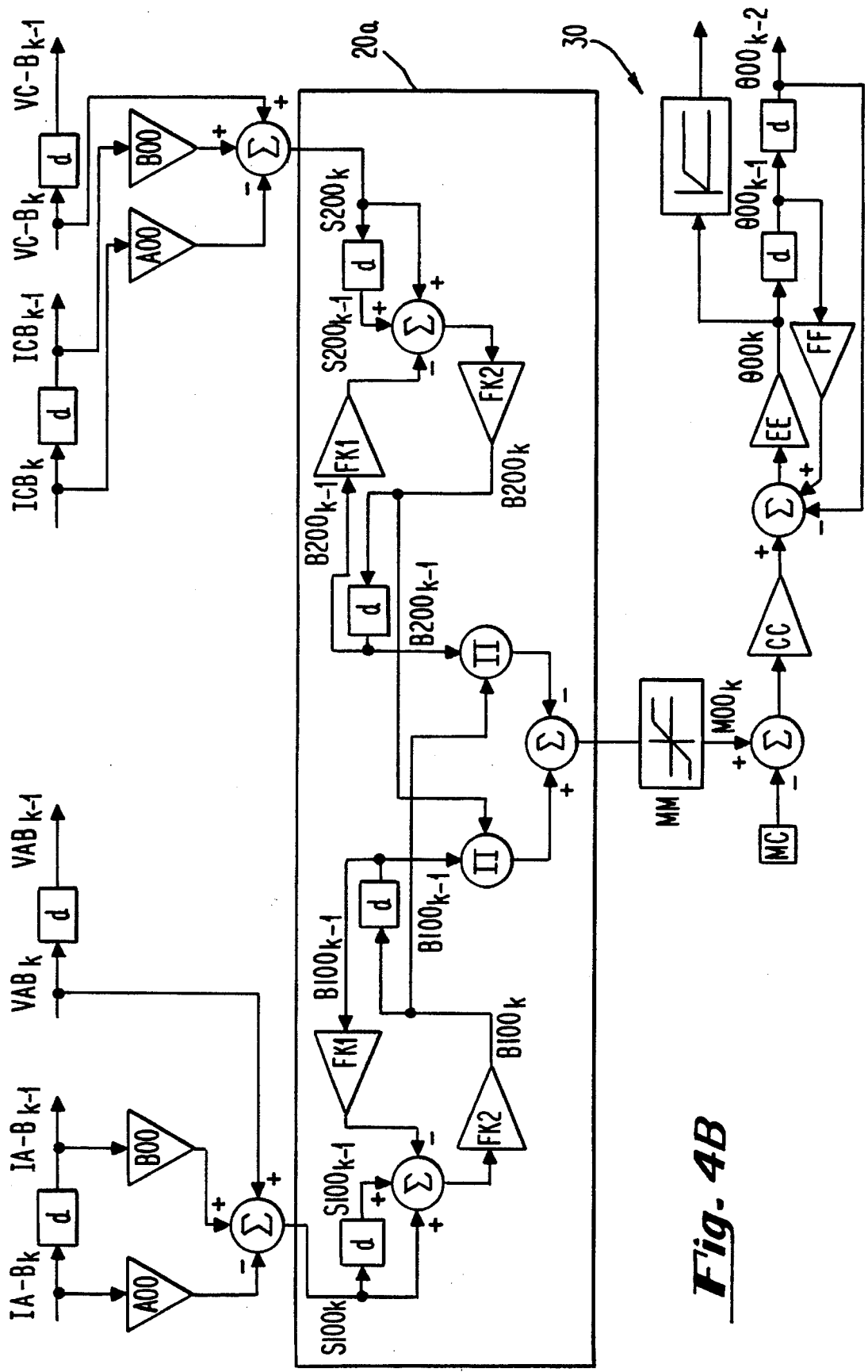
FIG. 4B is a block diagram of one embodiment of a phase-to-phase distance unit using the delay operator "d".

FIG. 4B is a block diagram of one implementation of the above equations for a phase-to-phase distance unit. Notice that the delta currents Iab and Icb are sampled, delayed and combined with the sampled and delayed delta voltages Vab and Vcb. The combination for each are the inputs to a numerical comparator 20a, which is like the numerical comparator 20 described above. The output of the numerical comparator is coupled to a clipping unit denoted "MM", which forms part of a trip comparator 30 (described below). The equations for B1 and B2 are implemented and the cross multiplication of $B1_k$ times $B2_{k+1}$ and $B1_{k+1}$ times $B2_k$ is employed to obtain the $M_k$ term. The amplifiers are labelled "A00", "B00", "CC", "EE", "FF", "FK1", and "FK2" in accordance with their gains, as set forth in the following list:

A00=Rc+Lc/$\Delta$t
B00=Lc/$\Delta$t
CC=$\Delta t^2$/l
EE=1/(1+$\Delta t^2$ KC/l+$\Delta$t KD/l)
FF=2+$\Delta$t KD/l
FK1=(2 LB–$\Delta$t RB)/$\Delta$t
FK2=$\Delta$t/($\Delta$t RB+2 LB).

(Note that CC, EE and FF are related to the trip comparator).

2. Phase-To-Ground Unit

The inputs to a well known means for detecting phase-to-ground faults are:

$$S1=VA-(IA-K0I0)Zc$$

$$S2=VC-VB$$

where $$I0 = \frac{IA+IB+IC}{3}$$

$$Zc = Rc + jXc = Rc + j2\pi fLc$$

$$K0 = Kr + jKi = \frac{Z0c - Zc}{Zc}$$

The circuit schematically depicted in FIG. 4C simulates the above equations. If these equations are made discrete and are applied to the numerical comparator equations, we obtain:

$$S1_k = Va_k - \left(Rc+\frac{LC}{\Delta t}\right)Ia_k + \left(\frac{LC}{\Delta t}\right)Ia_{k-1} -$$

$$\left(KrRc - KiXc + \frac{KrXc + K1Rc}{2\pi f\Delta t}\right)I0_k + \left(\frac{KrXc + KiRc}{2\pi f\Delta t}\right)I0_{k-1}$$

$$S2_k = Vc_k - Vb_k$$

which are the inputs to the numerical comparator derived above.

Figure 4D:
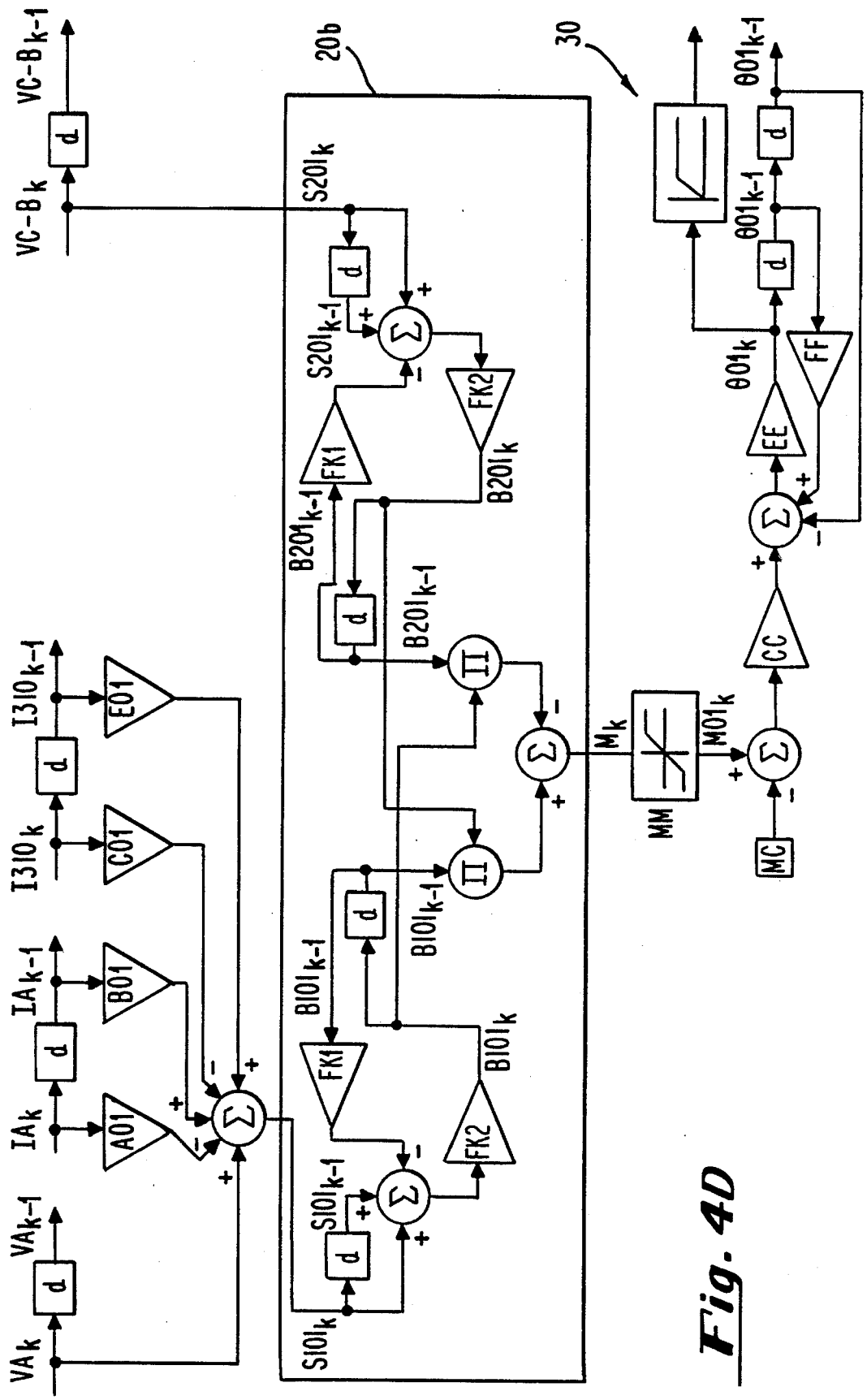
FIG. 4D is a block diagram of one embodiment of a phase-to-ground unit in accordance with the present invention.

FIG. 4D is a block diagram of one embodiment of a phase-to-ground unit in accordance with the present invention. The currents and voltages shown are sampled and combined in the adders as shown, and then input to the numerical comparator 20b. The B1 and B2 terms are then cross multiplied and $M_k$ is obtained and fed to the trip comparator 30 (described below). The amplifiers are labelled "A01", "B01", "C01", "E01", "CC", "EE", and "FF" in accordance with their gains, as set forth in the following list:

A01=Rc+Lc/$\Delta$t
B01=Lc/$\Delta$t
C01=(Kr Rc–Kl Xc)/3+(Kr Xc+Kl RC)/3$\omega$ $\Delta$t
E01=(Kr Xc+Kl RC)/3$\omega$ $\Delta$t
CC=1/(1+$\Delta t^2$ KC/l+$\Delta$t KD/l)
EE=$\Delta t^2$/l
FF=2+$\Delta$t KD/l.

In sum, a general procedure for obtaining impedance units (distance units) has been described. The units obtained are high speed since they require only three sampling periods (k–1, k, k+1) to obtain a trip criterion, regardless of the sampling frequency. Finally, many other distance units can be obtained by the procedure disclosed herein. The above-described distance units, the phase-to-phase distance unit and the ground distance unit (also referred as the quadrature polarized ground distance unit), are just two examples of the different principles used in protective relaying to obtain distance units. The procedure described above can produce any type of distance unit now used in industry requiring the comparison of two phasor quantities.

D. Directional Unit

Figure 5A:
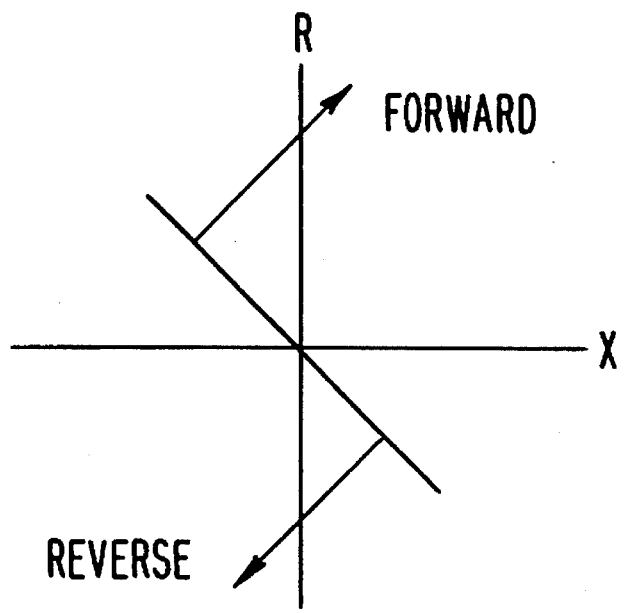
FIG. 5A depicts the required characteristic of a directional unit on the R-X plane. The directional units described in this specification exhibit this characteristic.
Figure 5B:
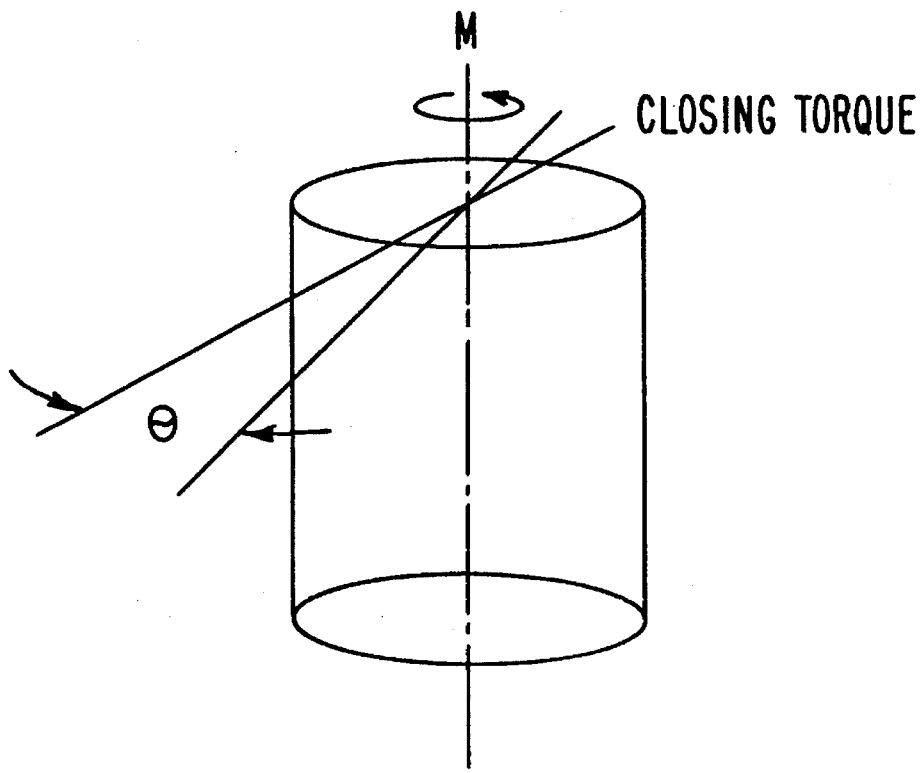
FIG. 5B illustrates the idealized cylinder unit and the relationship between M (torque) and θ (angle).

Directional units are devices required in protective relaying to indicate the direction of power flow. Ground directional units derived from the numerical comparator disclosed above are fast, making them ideal for protective relaying applications and in combination with distance units derived from the numerical comparator. FIG. 5A illustrates the characteristics of such directional units on the R-X plane. In this example, the forward direction indicates that power is flowing into the transmission line. The reverse direction indicates that power is flowing from the transmission line.

Directional units come in two categories, phase directional units and ground directional units. Phase directional units operate under all conditions. Ground directional units operate only when there is an unbalance in the power system. The following directional units have been developed:

1. Negative Sequence Polarized Directional Unit

Using the output of a numerical symmetrical components filter, the following equations are used to implement a negative sequence polarized directional unit:

$$B1_k=FK2\ (V2_k+2\ V2_{k-1}+V2_{k-2}-FK1\ B1_{k-1})$$

$$B2_k=FK2\ (I2_k+2\ I2_{k-1}+I2_{k-2}-FK1\ B2_{k-1})$$

$$M_k=B2_kB1_{k-1}-B1_kB2_{k-1}$$

In the above equations, V2 and I2 are outputs of the numerical symmetrical components filter, an example which is described below.

2. Zero Sequence Polarized Directional Unit

The following equations can be used to implement a zero sequence polarized ground directional unit:

$$B1_k=FK2\ (3V0_k+2\cdot 3V0_{k-1}+3V0_{k-2}-FK1\ B1_{k-1})$$

$$B2_k=FK2\ (AA\ 3I0_k+AB\ 3I0_{k-1}+BB\ 3I0_{k-2}-FK1\ B2_{k-1})$$

$$M_k = B2_k B1_{k-1} - B1_k B2_{k-1}$$

where:

$$AA = \frac{\sqrt{3}}{4} - \frac{1}{4\pi f \Delta t}$$

$$BB = \frac{\sqrt{3}}{4} + \frac{1}{4\pi f \Delta t}$$

$$AB = AA + BB.$$

In the above equations, $3V0 = VA+VB+VC$ and $3I0 = IA+IB+IC$.

3. Current Polarized Ground Directional Unit

If Ipol(t) is an input from a grounding point in the power system, a ground directional unit can be implemented with the following equations:

$$B1_k = FK2\left(\frac{3I0_k - 3I0_{k-2}}{\Delta t} - FK1\, B1_{k-1}\right)$$

$$B2_k = FK2(Ipol_K + 2Ipol_{K-1} + Ipol_{K-2} - FK1\, B2_{K-1})$$

$$M_k = B1_{k-1} B2_k - B2_{k-1} B1_k.$$

4. Phase Directional Unit

A phase directional unit can be implemented with the following equations:

$$B1_k = FK2(-VCB_K - 2VCB_{K-1} - VCB_{K-2} - FK1 B1_{K-1})$$

$$B2_2 = FK2(AA\, IA_K + ABIA_{K-1} + BBIAK-2 - FK1\, B2_{K-1})$$

$$M_k = B1_{k-1} B2_k - B2_{k-1} B1_k$$

where:

$$AA = \left(\frac{1}{4} + \frac{\sqrt{3}}{4\pi f \Delta t}\right)$$

$$BB = \left(\frac{1}{4} - \frac{\sqrt{3}}{4\pi f \Delta t}\right)$$

$$AB = AA + BB$$

and VCB is the delta voltage (VC–VB).

Other directional units can be implemented with the numerical comparator disclosed above. The above equations determine the "torque" of the unit, which can be combined with a numerical trip comparator.

FIGS. 5C to 5F depict the processing performed for the directional units.

Figure 5C:
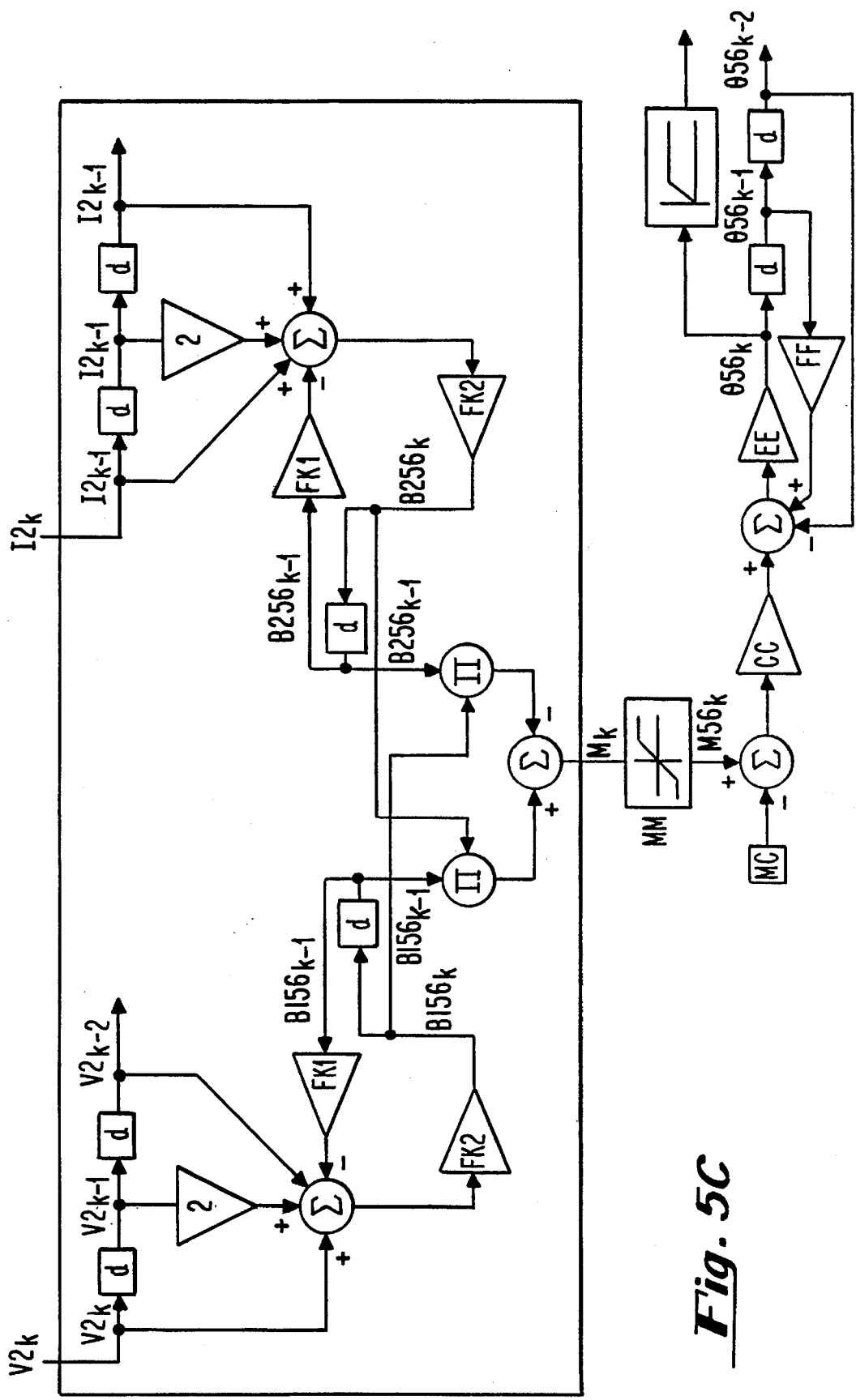
FIGS. 5C to 5F depict the processing performed by the numerical comparator directional units in accordance with the present invention.

FIG. 5C illustrates the data flow for the negative sequence polarized ground directional unit, which comprises a numerical comparator 20c and a trip comparator 30. The V2 and I2 inputs to the numerical comparator 20c are derived from a symmetrical components filter. The implementation of the equations of the negative sequence polarized ground directional units combines the samples of V2 and I2 to produce the B1 and B2 terms that are cross multiplied to obtain the $M_k$ term, which is fed to the trip comparator 30 The amplifiers labelled "CC", "EE", "FF", "FK1", and "FK2" have the following gains:
 CC=1/(1+$\Delta t^2$ KC/l+$\Delta t$ KD/l)
 EE=$\Delta t^2$/l
 FF=2+$\Delta t$ KD/l
 FK1=(2 LB–$\Delta t$ RB)/$\Delta t$
 FK2=$\Delta t$/($\Delta t$ RB+2 LB).

Figure 5D:
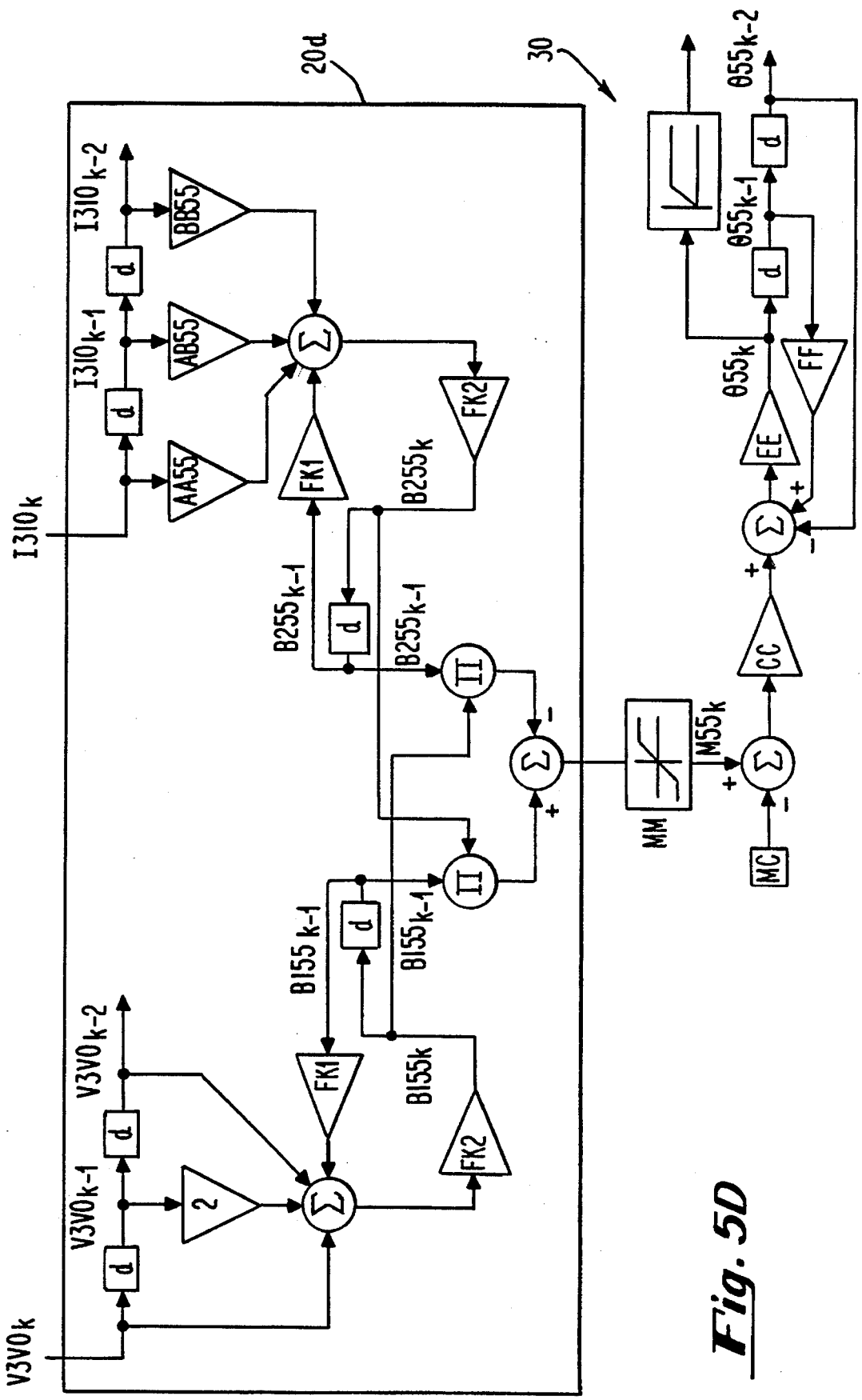

FIG. 5D illustrates the data flow of the zero sequence polarized ground directional unit. The 3V0 and 3I0 terms are derived from the actual power system samples (3V0=VA+VB+VC and 3I0=IA+IB+IC). The implementation of the equations of the zero sequence polarized ground directional unit combines the samples of 3V0 and 3I0 to produce the B1 and B2 terms that are input to the numerical comparator 20d and cross multiplied to obtain the $M_k$ term fed to the trip comparator 30. The amplifiers labelled "AA55", "BB55" and "AB55" have the following gains:
 AA55=sqrt(3)/4–1/(4II f $\Delta t$)
 BB55=sqrt(3)/4+1/(4II f $\Delta t$)
 AB55=AA55+BB55.

Figure 5E:
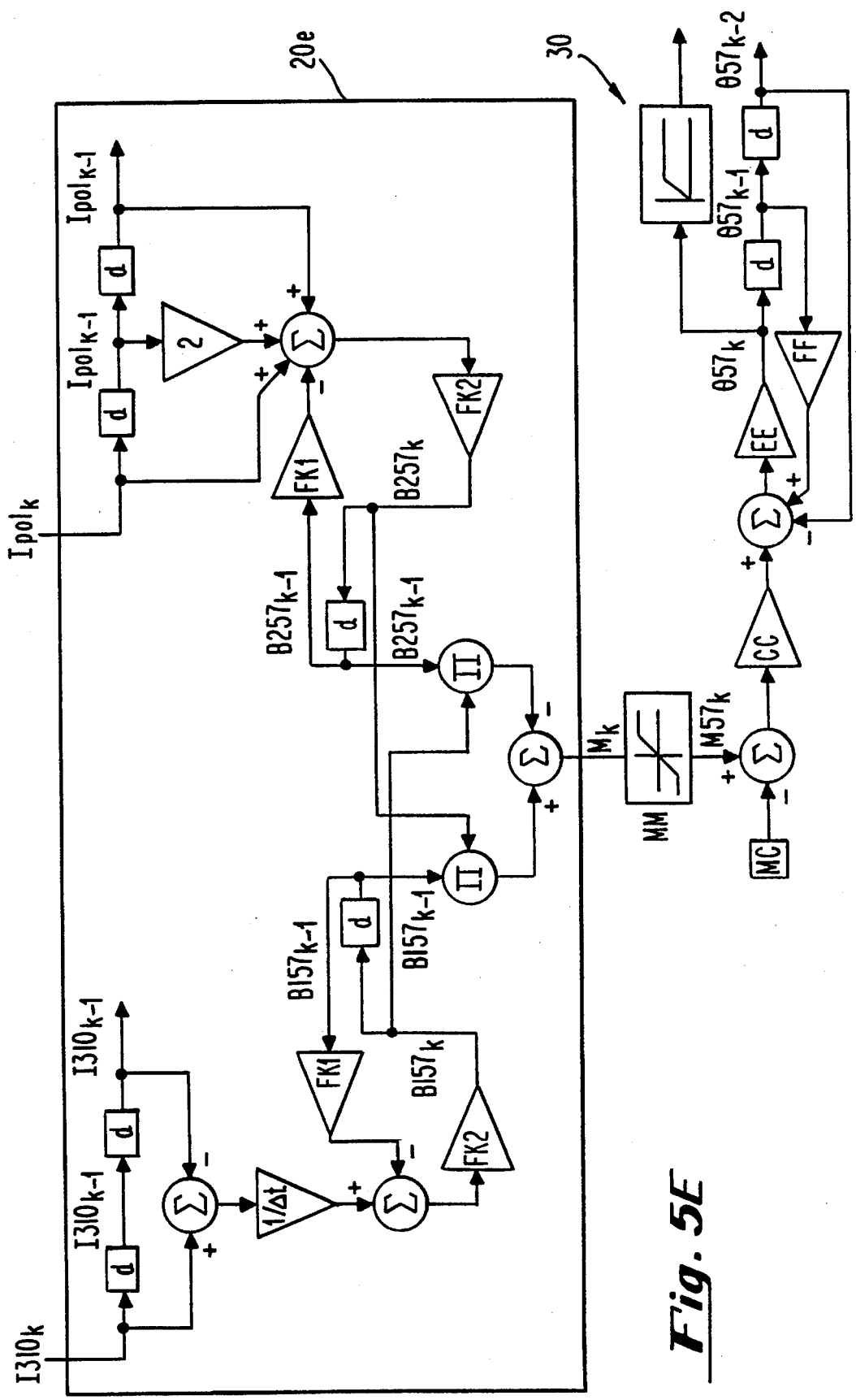

FIG. 5E illustrates the data flow of the current polarized ground directional unit comprising a numerical comparator 20e and a trip comparator 30. The 3I0 term input to the numerical comparator is derived from the actual power system samples (3I0=IA+IB+IC) and the Ipol samples are the actual samples of a current obtained from a suitable grounding point of the power system. The implementation of the equations of the current polarized ground directional unit combines the samples of 3I0 and Ipol to produce the B1 and B2 terms that are cross multiplied to obtain the $M_k$ term fed to the trip comparator.

Figure 5F:
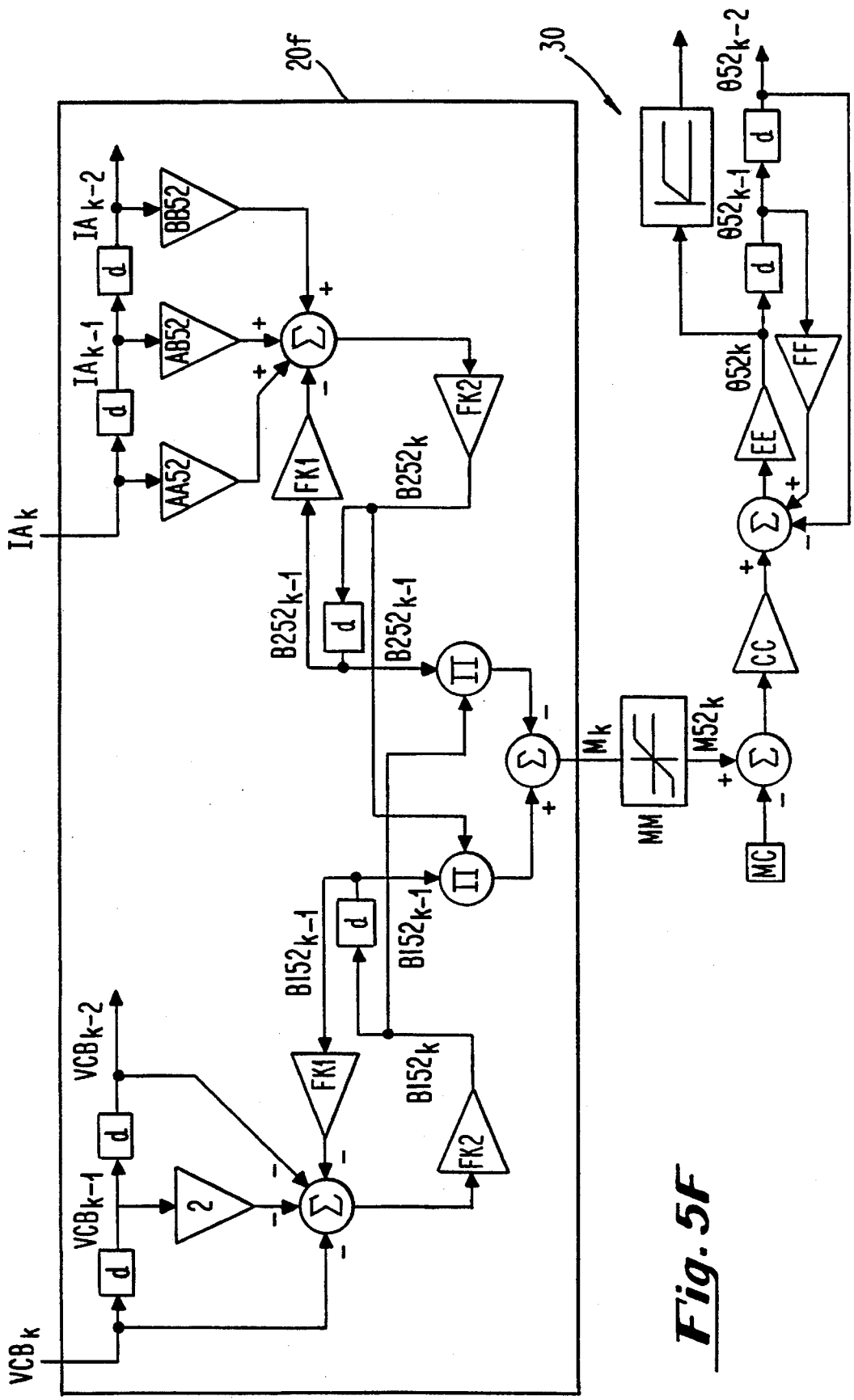

FIG. 5F illustrates the data flow of the phase directional unit (phase A) comprising a numerical comparator 20f and a trip comparator 30. The VCB term input to the numerical comparator is VC–VB, where VC and VB are the actual samples from the C and B phases. IA is the phase A current. This implementation of the equations of the phase directional unit combines the samples of VCB and IA to produce B1 and B2 terms that are cross multiplied to obtain the $M_k$ term fed to the trip comparator. The amplifiers labelled "AA52", "BB52" and "AB52" have the following gains:
 AA52=¼+sqrt(3)/(4II f $\Delta t$)
 BB52=¼+sqrt(3)/(4II f $\Delta t$)
 AB52=AA52+BB52.

The above-described procedures are exemplary procedures for directional units. Those skilled in this art will recognize that other directional units can be obtained with the invention disclosed herein.

E. Symmetrical Components Filter

Symmetrical component quantities are required for fast and reliable relaying of different parts of the power system. The procedures described below provide the symmetrical components in a time-dependent manner. These procedures are required employed in fast directional units and/or distance units. Three procedures will now be described.

1. Simulation of Existing Analog Filter

Figure 6A:
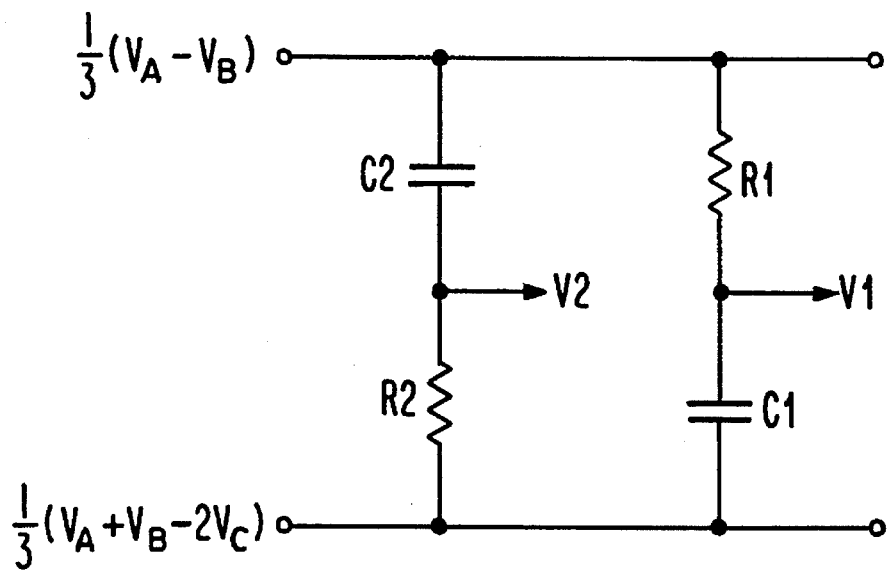
FIG. 6A depicts an analog symmetrical filter components.

FIG. 6A depicts an analog filter. The positive and negative sequence components in discrete form are given by the following equations:

$$V1_k = \frac{1}{3}(Va_k + Vb_k - 2Vc_k) +$$

$$\left(\frac{1}{1+\frac{\Delta t}{R1\,C1}}\right)\left(\left(\left(\frac{\Delta t}{R1\,C1}\right)\frac{1}{3}(2Vc_k - 2Vb_k)\right) + VC1_{k-1}\right)$$

where:

$$VC1_{k-1} = \left(\frac{\Delta t}{R1\,C1}\right)\frac{1}{3}(2Vc_{k-1} - 2Vb_{k-1}) + VC1_{k-2}$$

and $$V1_k = \frac{1}{3}(Va_k - Vb_k) - VC2_k$$

where:

-continued $$VC2_k = \left(\frac{1}{1+\frac{\Delta t}{R2\,C2}}\right)\left(\left(\left(\frac{\Delta t}{R2\,C2}\right)\frac{1}{3}(2Vc_k - 2Vb_k)\right) + VC2_{k-1}\right).$$

Constants C1, R1, C2 and R2 can be fine-tuned to obtain the corresponding optimized equations. There will be a set of R1, C1, R2 and C2 constants that produce the smallest error and the correct phase shift.

2. Direct Phase Shift

The symmetrical component equations are:

$$I1 = \tfrac{1}{3}(I_A + a\,IB + a^2 IC)$$

$$I2 = \tfrac{1}{3}(IA + a^2 IB + a\,IC)$$

These equations can be implemented by using the phase shifting identities, $$a = \left[-\frac{1}{2} + \frac{\sqrt{3}}{4\pi f}\frac{d}{dt}\right]$$

$$a^2 = \left[-\frac{1}{2} - \frac{\sqrt{3}}{4\pi f}\frac{d}{dt}\right].$$

Therefore, in discrete form:

$$3I1_k = Ia_K + \left[-\frac{1}{2}\,Ib_k + \frac{\sqrt{3}}{4\pi f \Delta t}(Ib_k - Ib_{k-1})\right] + \left[-\frac{1}{2}\,Ic_k - \frac{\sqrt{3}}{4\pi f \Delta t}(Ic_k - Ic_{k-1})\right]$$

$$3I2_{k+} = Ia_K + \left[-\frac{1}{2}\,Ib_k - \frac{\sqrt{3}}{4\pi f \Delta t}(Ib_k - Ib_{k-1})\right] + \left[-\frac{1}{2}\,Ic_k + \frac{\sqrt{3}}{4\pi f \Delta t}(Ic_k - Ic_{k-1})\right].$$

3. Clarke Components Derivation

By definition, the Clarke components are:

$$I\alpha = 3I1 + 3I2 = 2Ia - Ib - Ic$$

$$I\beta = \frac{3I1 - 3I2}{j} = \sqrt{3}\,(Ib - Ic)$$

It follows that:

$$3I1 = \tfrac{1}{2}(I\alpha + jI\beta)$$

$$3I2 = \tfrac{1}{2}(I\alpha - jI\beta)$$

Using the operator:

$$j = \frac{1}{2\pi f}\frac{d}{dt}$$

it follows that:

$$3I1 = \frac{1}{2}\left(I\alpha + \frac{1}{2\pi f}\frac{dI\beta}{dt}\right)$$

$$3I2 = \frac{1}{2}\left(I\alpha - \frac{1}{2\pi f}\frac{dI\beta}{dt}\right)$$

Making the equations discrete:

$$3I1_k = \frac{1}{2}\left(I\alpha_k + \frac{1}{2\pi f}\,\frac{I\beta_k - I\beta_{k-1}}{\Delta t}\right)$$

$$3I2_k = \frac{1}{2}\left(I\alpha_k - \frac{1}{2\pi f}\,\frac{I\beta_k - I\beta_{k-1}}{\Delta t}\right)$$

This implementation is the simplest. However, a further step to "align" the time with respect to the derivatives can be performed to reduce errors and increase the accuracy of the method:

$$3I1_k = \frac{I\alpha_k - I\alpha_{k-1}}{4} + \frac{1}{4\pi f}\left(\frac{I\beta_k - I\beta_{k-1}}{\Delta t}\right)$$

$$3I2_k = \frac{I\alpha_k - I\alpha_{k-1}}{4} - \frac{1}{4\pi f}\left(\frac{I\beta_k - I\beta_{k-1}}{\Delta t}\right).$$

Figure 6B:
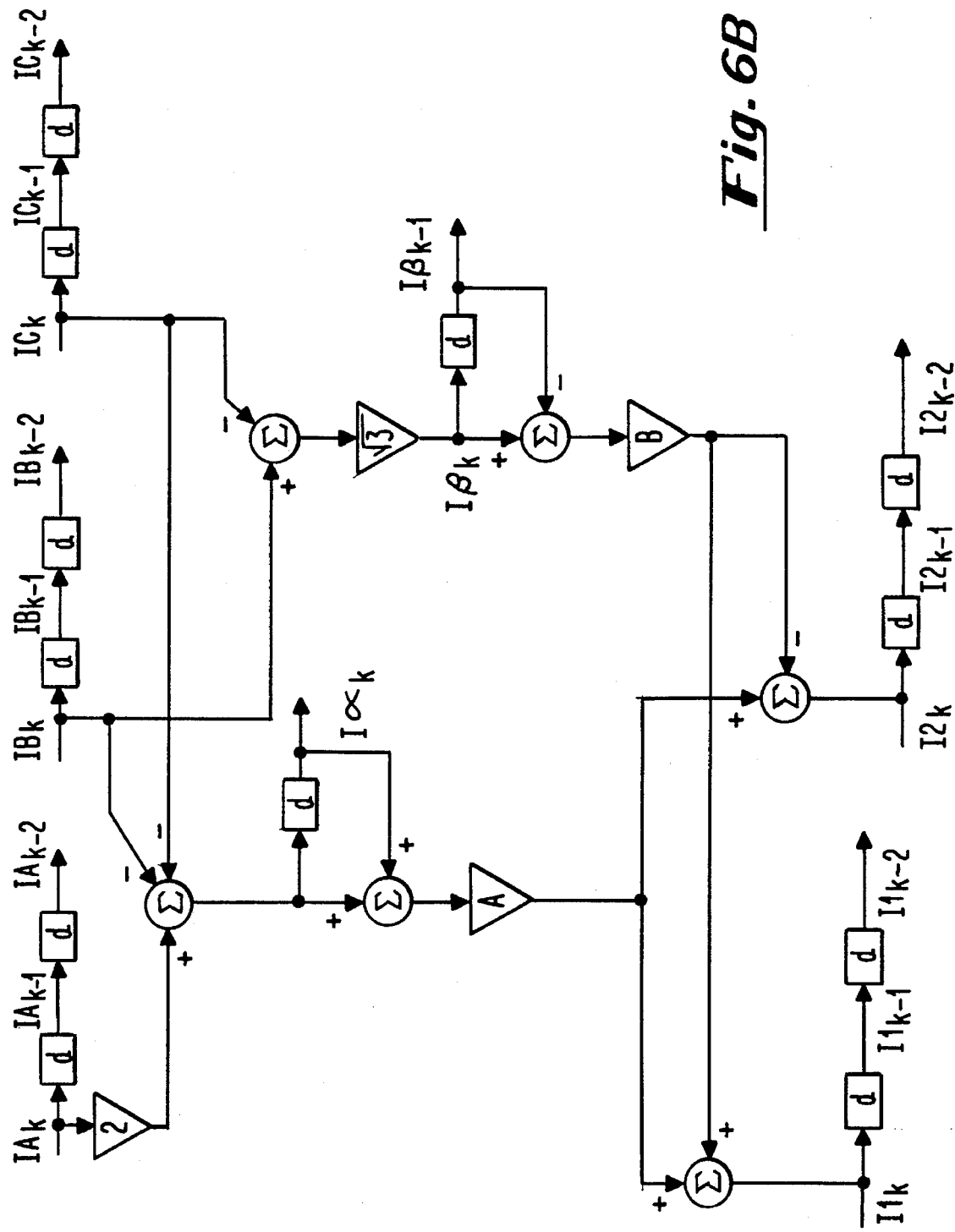
FIGS. 6B and 6C schematically depict illustrative embodiments of symmetrical components filters in accordance with the present invention.
Figure 6C:
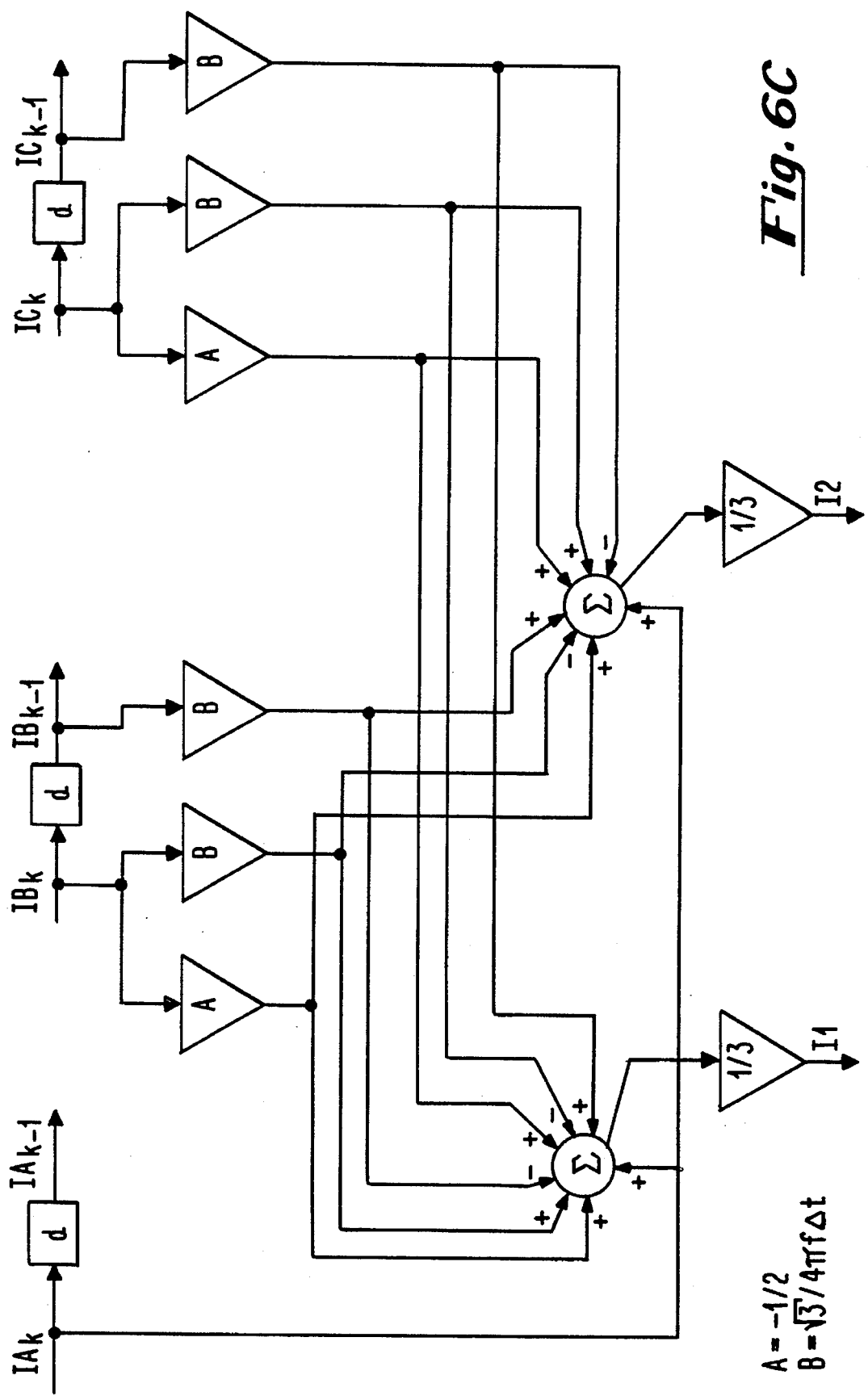

FIGS. 6B and 6C schematically depict illustrative embodiments of symmetrical components filters in accordance with procedures 3 (Clarke components) and 2 (Direct phase shift), respectively.

FIG. 6B illustrates the combination of IA, IB and IC samples to obtain the Iα and Iβ components and later manipulate them, according to the above equations, to obtain the I1 and I2 (positive and negative) components of the currents. The same process could be performed for voltages to obtain the positive and negative sequence components of the voltages. The amplifiers labelled "A" and "B" have the following gains:

A=¼
B=1/(4Π f αt).

FIG. 6C illustrates the combination of IA, IB and IC samples, using the direct phase shift equivalent (the A and B constants), to obtain the I1 and I2 components of the currents. The same procedure could be followed to obtain the positive and negative sequence components of voltages. In this embodiment, amplifiers "A" and "B" have the following gains:

A=–½
B=sqrt(3)/(4Π f Δt).

F. Over-Current Unit

The over-current unit disclosed below employs a numerical algorithm that is fast and unaffected by DC offsets. It can be used as a level detector for voltage or current.

To implement a single input over-current unit, one of the numerical comparator inputs should be phase-shifted. Using this criterion, the following equations can be employed to provide an over-current unit free of the effects of DC offset. This unit is extremely fast.

$$B1_k = FK2\,(IA_k + IA_{k-1} - FK1\,B1_{k-1})$$

$$B2_k = FK2\,(IA_k + 2IA_{k-1} + IA_{k-2} - FK1\,B2_{k-1})$$

$$M_k = B1_{k-1} B2_k - B2_{k-1} B1_k$$

This output "torque" ($M_k$) can be fed into the numerical trip comparator and the opposing torque constant, MC, can be adjusted for the trip level. In the above equations, IA could be a current, voltage, or any other power system quantity (such as a symmetrical component).

Figure 7:
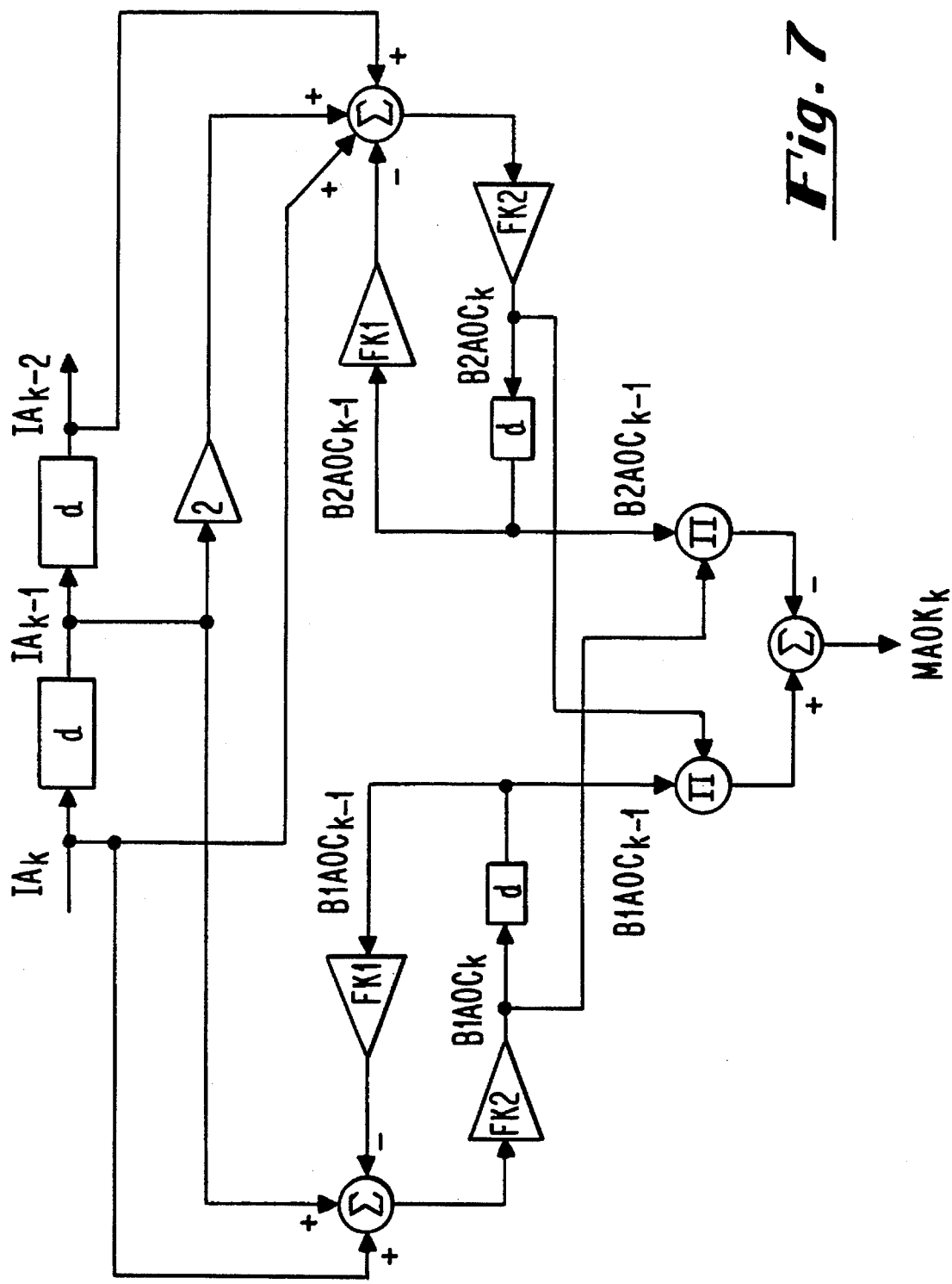
FIG. 7 schematically depicts one embodiment of an over-current unit (which can use voltage inputs as well as current inputs) and its implementation along with a trip comparator in accordance with the present invention. (Note that many units derived with the numerical comparator will use the trip comparator, which is a decision making processor.)

FIG. 7 schematically depicts one embodiment of an over-current unit 20g and its implementation in accordance with the present invention. The inputs to the numerical comparator, in this embodiment, are derived as shown from the single quantity IA. The samples are combined to obtain the B1 and B2 quantities, as expressed in the above equations. The output, $M_k$, can be used to feed the numerical trip comparator 30 described below. Amplifiers "FK1" and "FK2" have the following gains:

FK1=(2 LB−Δt RB)/Δt
FK2=Δt/(Δt RB+2 LB)
RB=1.0
LB=0.001.

G. Trip Comparator

The procedure described next can be used in the implementation of a numerical trip comparator relay unit. The numerical trip comparator is a complement of all the embodiments described above. The trip comparator makes the trip decision. In other words, it decides when to indicate the operation of the unit to which it is connected.

A numerical model of the travel of an electromechanical cylinder unit contact should resemble the electro-mechanical operation of the cylinder unit. The numerical comparator depicted in FIG. 3A was employed to develop the numerical trip comparator disclosed herein.

Figure 8A:
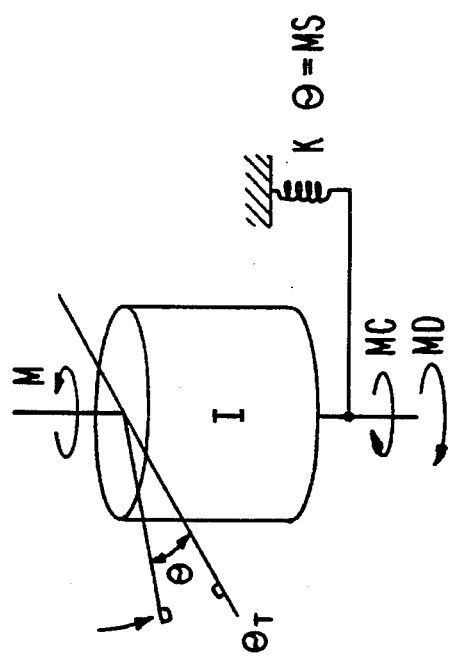
FIG. 8A depicts the mechanical system analog for the trip comparator.

In FIG. 8A:

θ=the angle of travel, $θ_T$=the trip angle,

M=the electro-mechanical torque,

MS=the opposing spring (force) torque,

MC=the constant opposing torque,

I=the moment of inertia of the cylinder.

The electro-mechanical equation for the model is:

$$I\frac{d^2θ}{dt^2} = (M-MC) - KD\frac{dθ}{dt} - KSθ.$$

If the equation is discretized, $θ_k$ can be expressed as:

$$θ_k \frac{1}{EE} - θ_{k-1}FF + θ_{k-2} = CC(M-MC)$$

where:

$$EE = \frac{1}{1+\frac{ΔtKD}{I}+\frac{Δt^2KC}{I}}$$

$$FF = \frac{ΔtKD}{I}+2$$

$$CC = \frac{Δt^2}{I}.$$

In the numerical trip comparator, the following conditions are applied:

1. If $(M_k-MC)<0$, then the next $θ_k$ is zero.
2. If $θ_k>θ_T$, then the next $θ_k$ is set to $θ_T$, and a trip is issued.

Figure 8B:
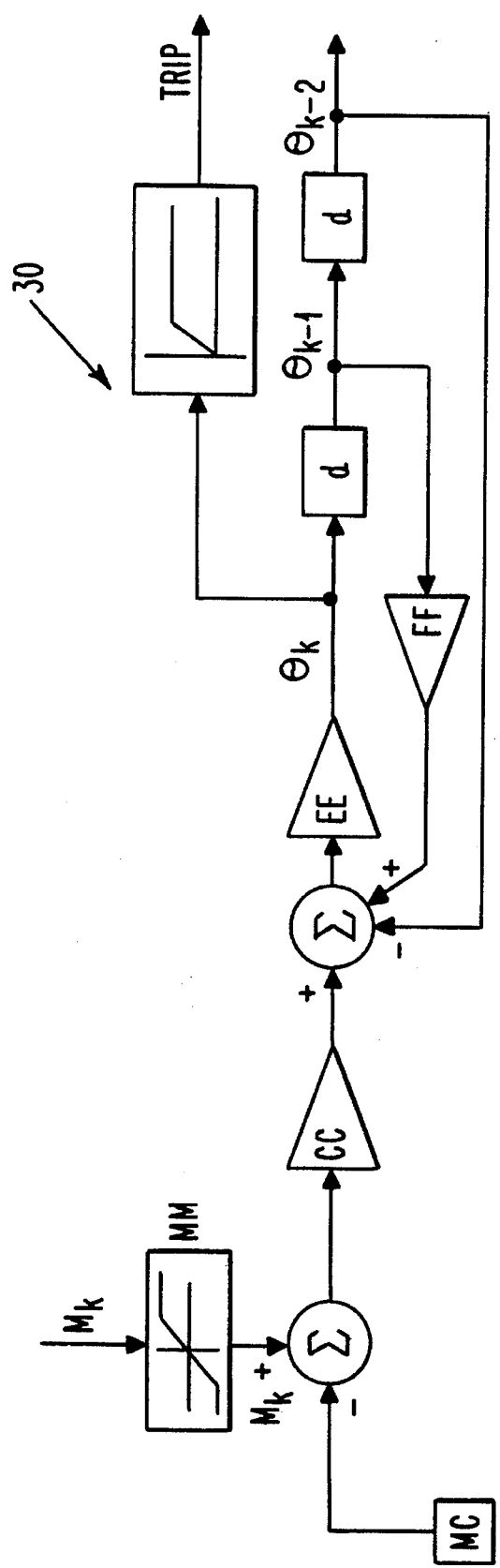
FIG. 8B schematically depicts one embodiment of a numerical trip comparator in accordance with the present invention.

FIG. 8B schematically depicts one embodiment of a numerical trip comparator 30 in accordance with the present invention. The trip comparator receives as input the torque $M_k$ (generated in any of the above-described units) and, as shown in the FIG. 8B, it is limited to −MM<$M_k$<+MM and then the opposing bias torque MC is subtracted from $M_k$. The rest of the circuitry implements the above equations. The output $θ_k$ is later compared to $θ_T$ for a trip, as mentioned in condition 2. The gains of amplifiers "CC", "EE", and "FF" are disclosed above.

Figure 9:
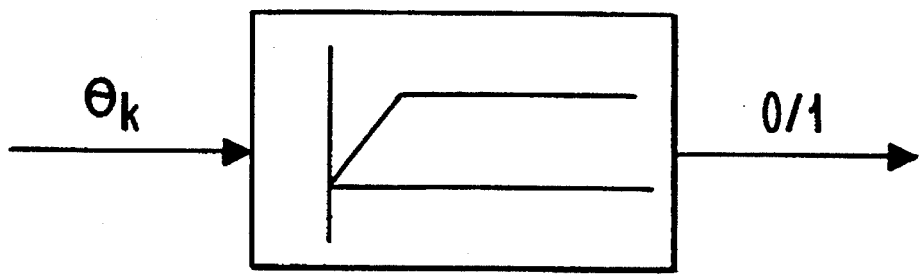
FIG. 9 schematically depicts the functionality of the trip comparator.
Figure 10:
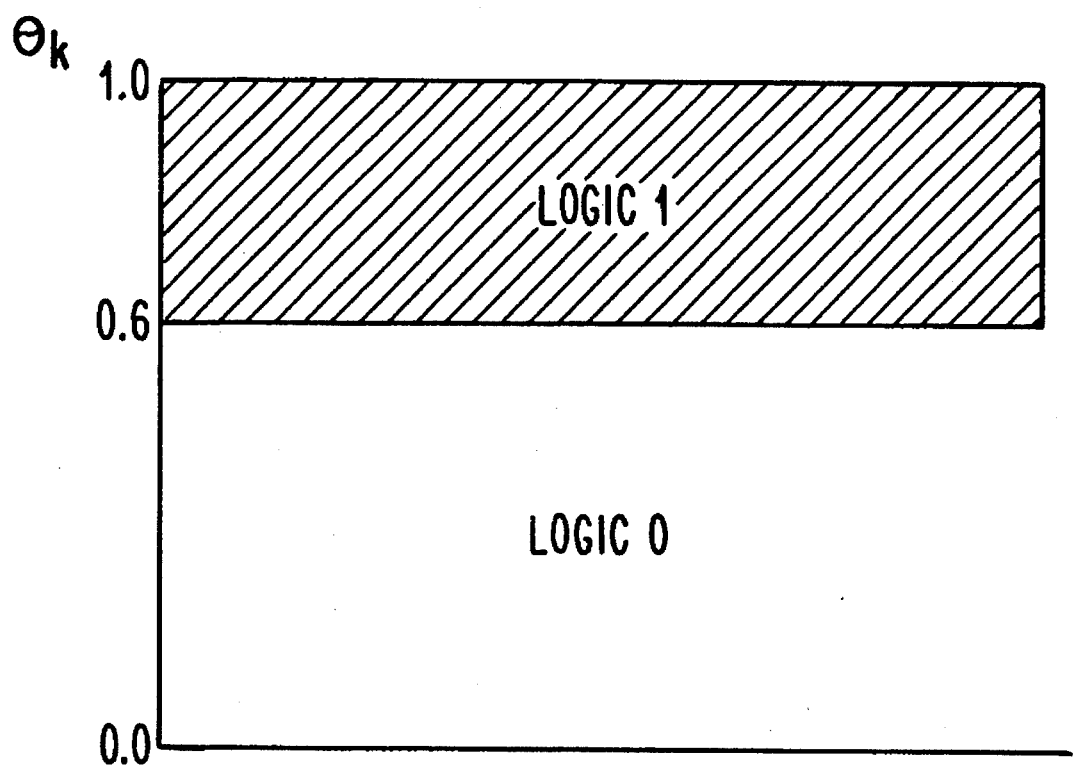
FIG. 10 is an exemplary graph of the output of the trip comparator.

Referring now to FIGS. 9 and 10, which illustrate the operation of the trip comparator, this unit issues a logic "0" (false) if the unit has not operated and issues a logic "1" (true) if the unit has operated. The variable "0" is the input to the block and is compared to upper and lower limits. It should be mentioned that FIG. 10 illustrates typical limits; however, other limits can be used.

If the instantaneous value of 0 is greater than 0.6 (in this example a logic "1" (true) is issued to the protective relaying logic in the microprocessor-based apparatus. If it is less than 0.6, a logic "0" (false) is issued to the protective relaying logic in the microprocessor-based apparatus. The limits of the variable are from 0 to 1 in this example.

Those skilled in the art will appreciate that the present invention can be embodied in apparatus and processes not exactly like those described hereinabove. The numerical trip comparator is used in protective relaying to implement numerically the function(s) of a phase comparator. The cylinder unit in electromechanical relays is the building block of many different units used in protective relaying, including distance units, directional units, over/undercurrent units, over/undervoltage units, pilot wire and other specialized applications. The numerical comparator is another phase comparator unit that can be used to develop relaying units like the ones discussed above.

The development of the numerical comparator algorithms described above resulted from the analysis of the behavior or the cylinder unit, but the equations have been modified. They are not an exact model of the cylinder unit. Indeed, the flexibility of the equations, factors, multiplier, ranges, etc., which are the equations to be implemented in microprocessor based apparatus, allow the designer to accommodate the behavior of the unit with more flexibility than an actual cylinder unit.

I claim:

1. A real-time process for comparing two phasors, each said phasor being represented by a waveform (S1(t), S2(t)) characterized by a magnitude and a phase angle, comprising the steps of:

(a) obtaining a sample ($S1_k$) representative of the magnitude of a first phasor at a first instant of time, and obtaining a sample ($S2_k$) representative of the magnitude of a second phasor at said first instant of time;

(b) obtaining a sample ($S1_{k+1}$) representative of the magnitude of said first phasor at a second instant of time, and obtaining a sample ($S2_{k+1}$) representative of the magnitude of said second phasor at said second instant of time;

(c) obtaining derived quantities $B1_k$, $B2_k$, $B1_{k+1}$ and $B2_{k+1}$ from $S1_k$, $S1_{k+1}$, $S2_k$, $S2_{k+1}$;

(d) multiplying $B1_k$ by $B2_{k+1}$ and multiplying $B2_k$ by $B1_{k+1}$ to produce a first product $B1_k B2_{k+1}$ and a second product $B2_k B1_{k+1}$;

(e) summing said first and second products to produce a sum; and (f) scaling said sum to produce a result ($M_{k+1}$) indicative of a phase difference, if any, between said first and second phasors.

2. A process as recited in claim 1, wherein $B1_k$ and $B2_k$ are derived in accordance with the following equations:

$$B1_k = FK2\ [S1_k + S1_{k-1} - FK1\ B1_{k-1}]$$

$$B2_k = FK2\ [S2_k + S2_{k-1} - FK1\ B2_{k-1}]$$

wherein FK1 and FK2 are constants set in accordance with prescribed equations.

3. A process as recited in claim 2, wherein FK1 and FK2 are determined by:

$$FK1 = \frac{\Delta t \, RB - 2LB}{\Delta t}$$

$$FK2 = \frac{\Delta t}{\Delta t \, RB + 2LB}$$

where RB and LB are constants.

4. A process as recited in claim 1, wherein $S1_k$ and $S2_k$ are obtained by sampling a transmission line.

5. A process as recited in claim 4, wherein said waveforms S1(t) and S2(t) are voltages or currents that oscillate sinusoidally, or a combination of voltages and currents.

6. A process as recited in claim 4, further comprising the step of employing said result $M_{k+1}$ to determine whether a fault has occurred on said transmission line.

7. A process as recited in claim 6, wherein said result is employed to detect a phase-to-phase fault in a three-phase transmission line system; and S1(t), S2(t) are obtained from the phase-to-phase voltages and the phase currents.

8. A process as recited in claim 6, wherein said result is employed to detect a phase-to-ground fault in a three-phase transmission line system; and S1(t), S2(t) are obtained from the phase-to-ground voltages and the phase currents.

9. A process as recited in claim 4, further comprising the step of employing said result $M_{k+1}$ to determine the direction of power flow in said transmission line.

10. A process as recited in claim 4, further comprising the step of employing said result $M_{k+1}$ to determine whether a voltage or current on said transmission line has exceeded a predetermined threshold.

11. A process as recited in claim 4, further comprising the step of subtracting a predetermined constant (MC) from said result $M_{k+1}$, and employing the difference $M_{k+1}-MC$ to obtain a signal ($\theta_{k+1}$) indicative of the energy contained in the difference signal S1(t)−S2(t).

12. A process as recited in claim 1, wherein the scaling step comprises multiplying said sum by a predetermined number proportional to the sampling period.

13. An apparatus for comparing two phasors in real-time, each said phasor being represented by a waveform (S1(t), S2(t)) characterized by a magnitude and a phase angle, comprising:

(a) sampling means for obtaining a sample ($S1_k$) representative of the magnitude of a first phasor at a first instant of time, obtaining a sample ($S2_k$) representative of the magnitude of a second phasor at said first instant of time, obtaining a sample ($S1_{k+1}$) representative of the magnitude of said first phasor at a second instant of time, and obtaining a sample ($S2_{k+1}$) representative of the magnitude of said second phasor at said second instant of time;

(b) means for obtaining derived quantities $B1_k$, $B2_k$, $B1_{k+1}$ and $B2_{k+1}$ from $S1_k$, $S1_{k+1}$, $S2_k$, $S2_{k+1}$;

(c) multiplying means for multiplying $B1_k$ by $B2_{k+1}$ and multiplying $B2_k$ by $B_{k+1}$ to produce a first product $B1_k B2_{k+1}$ and a second product $B2_k B1_{k+1}$; and (d) summing means for summing said first and second products to produce a result ($M_{k+1}$) indicative of a phase difference, if any, between said first and second phasors.

14. An apparatus as recited in claim 13, further comprising scaling means for scaling said result ($M_{k-1}$), wherein the scaling means multiplies said result by a predetermined number proportional to the sampling period.

15. An apparatus as recited in claim 13, wherein $B1_k$ and $B2_k$ are derived in accordance with the following equations:

$$B1_k = FK2 \, [S1_k + S1_{k-1} - FK1 \, B1_{k-1}]$$

$$B2_k = FK2 \, [S2_k + S2_{k-1} - FK1 \, B2_{k-1}]$$

wherein FK1 and FK2 are constants set in accordance with prescribed equations.

16. An apparatus as recited in claim 15, wherein FK1 and FK2 are determined by:

$$FK1 = \frac{\Delta t \, RB - 2LB}{\Delta t}$$

$$FK2 = \frac{\Delta t}{\Delta t \, RB + 2LB}$$

where RB and LB are constants.

17. An apparatus as recited in claim 13, wherein $S1_k$ and $S2_k$ are obtained by sampling a voltage or current from a transmission line.

18. An apparatus as recited in claim 17, wherein said waveforms S1(t) and S2(t) are voltages or currents that oscillate sinusoidally, or a combination of voltages and currents.

19. An apparatus as recited in claim 17, further comprising means for employing said result $M_{k+1}$ to determine whether a fault has occurred on said transmission line.

20. An apparatus as recited in claim 19, wherein said result is employed to detect a phase-to-phase fault in a three-phase transmission line system; and S1(t), S2(t) are obtained from the phase-to-phase voltages and the phase currents.

21. An apparatus as recited in claim 19, wherein said result is employed to detect a phase-to-ground fault in a three-phase transmission line system; and S1(t), S2(t) are obtained from the phase-to-ground voltages and the phase currents.

22. An apparatus as recited in claim 17, further comprising means for employing said result $M_{k+1}$ to determine the direction of power flow in said transmission line.

23. An apparatus as recited in claim 22, in combination with a symmetrical components filter, wherein sequence components output by said filter are inputs to the apparatus.

24. An apparatus as recited in claim 17, further comprising means for subtracting a predetermined constant (MC) from said result $M_{k-1}$, and employing the difference $M_{k+1}-MC$ to obtain a signal ($\theta_{k-1}$) indicative of the energy contained in the difference signal S1(t)−S2(t).

25. An apparatus as recited in claim 17, further comprising means for employing said result $M_{k+1}$ to determine whether a voltage or current on said transmission line has exceeded a predetermined threshold.

26. A real-time process for determining a phase difference between two waveforms, each of said waveforms having a magnitude and a phase angle, comprising the steps of:

(a) obtaining a plurality of samples of each said two waveforms representative of the magnitude of each said two waveforms at at least two different times; and (b) on the basis of said samples, computing a value $M_{k+1}$ indicative of the phase difference between said two waveforms.

27. A process defined in claim 26 wherein said waveforms are voltages or currents that oscillate sinusoidally, or a combination of voltages and currents.

28. A process as defined in claim 26, wherein said step of obtaining a plurality of samples of said two waveforms comprises:

(a1) obtaining a sample ($S1_k$) representative of the magnitude of a first of said waveforms at a first instant of time, and obtaining a sample ($S2_k$) representative of the magnitude of a second of said waveforms at said first instant of time;

(a2) obtaining a sample ($S1_{k+1}$) representative of the magnitude of said first waveform at a second instant of time, and obtaining a sample ($S2_{k+1}$) representative of the magnitude of said second waveform at said second instant of time.

29. A process as defined in claim 28, wherein step (b) comprises:

(b1) obtaining derived quantities $B1_k$, $B2_k$, $B1_{k+1}$ and $B2_{k+1}$ from $S1_k$, $S1_{k+1}$, $S2_k$, $S2_{k+1}$;

(b2) multiplying $B1_k$ by $B2_{k+1}$ and multiplying $B2_k$ by $B1_{k+1}$ to produce a first product $B1_k B2_{k+1}$ and a second product $B2_k B1_{k+1}$;

(b3) summing said first and second products to produce a sum; and (b4) scaling said sum to produce the value of $M_{k+1}$.

30. A process as defined in claim 29, wherein $B1_k$ and $B2_k$ are derived in accordance with the following equations:

$$B1_k = FK2 \ [S1_k + S1_{k-1} - FK1 \ B1_{k-1}]$$

$$B2_k = FK2 \ [S2_k + S2_{k-1} - FK1 \ B2_{k-1}]$$

wherein FK1 and FK2 are constants set in accordance with prescribed equations.

31. A process as defined in claim 30, wherein FK1 and FK2 are determined by:

$$FK1 = \frac{\Delta t \ RB - 2LB}{\Delta t}$$

$$FK2 = \frac{\Delta t}{\Delta t \ RB + 2LB}$$

where RB and LB are constants.

32. A process as defined in claim 29, wherein the scaling step comprises multiplying said sum by a predetermined number proportional to the sampling period.

33. A process as defined in claim 28 wherein $S1_k$ and $S2_k$ are obtained by sampling a transmission line.

34. A process as recited in claim 33, further comprising the step of subtracting a predetermined constant (MC) from $M_{k+1}$, and employing the difference $M_{k+1} - MC$ to obtain a signal ($\theta_{k+1}$) indicative of the energy contained in a difference signal $S1(t) - S2(t)$.

35. A process as recited in claim 34 further comprising the step of employing said value $M_{k+1}$ to determine whether a fault has occurred on said transmission line.

36. A process as recited in claim 35, wherein $M_{k+1}$ is employed to detect a phase-to-phase fault in a three-phase transmission line system; and $S1(t)$, $S2(t)$ are obtained from the phase-to-phase voltages and the phase currents.

37. A process as recited in claim 35 wherein $M_{k+1}$ is employed to detect a phase-to-ground fault in a three-phase transmission line system; and $S1(t)$, $S2(t)$ are obtained from the phase-to-ground voltages and the phase currents.

38. A process as recited in claim 34, further comprising the step of employing $M_{k+1}$ to determine the direction of power flow in said transmission line.

39. A process as recited in claim 33, further comprising the step of employing $M_{k+1}$ to determine whether a voltage or current on said transmission line has exceeded a predetermined threshold.

* * * * *